United States Patent
Sato

(10) Patent No.: US 11,101,282 B2
(45) Date of Patent: Aug. 24, 2021

(54) SEMICONDUCTOR STORAGE DEVICE

(71) Applicant: TOSHIBA MEMORY CORPORATION, Tokyo (JP)

(72) Inventor: Hiroyasu Sato, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/560,600

(22) Filed: Sep. 4, 2019

(65) Prior Publication Data

US 2020/0286908 A1 Sep. 10, 2020

(30) Foreign Application Priority Data

Mar. 5, 2019 (JP) .............................. JP2019-039971

(51) Int. Cl.
| | |
|---|---|
| *H01L 27/11573* | (2017.01) |
| *H01L 27/11565* | (2017.01) |
| *H01L 27/11553* | (2017.01) |
| *H01L 27/11519* | (2017.01) |
| *H01L 27/11526* | (2017.01) |
| *H01L 27/1158* | (2017.01) |

(52) U.S. Cl.
CPC .... *H01L 27/11573* (2013.01); *H01L 27/1158* (2013.01); *H01L 27/11519* (2013.01); *H01L 27/11526* (2013.01); *H01L 27/11553* (2013.01); *H01L 27/11565* (2013.01)

(58) Field of Classification Search
CPC ......... H01L 27/11573; H01L 27/11565; H01L 27/11553; H01L 27/11519; H01L 27/11526; H01L 27/1158; H01L 27/11582
See application file for complete search history.

(56) References Cited

U.S. PATENT DOCUMENTS

| | | | |
|---|---|---|---|
| 2016/0056169 A1* | 2/2016 | Lee ................... | H01L 27/11578 438/269 |
| 2017/0271349 A1 | 9/2017 | Miyagawa | |
| 2018/0026046 A1* | 1/2018 | Nam ................... | H01L 27/1157 257/314 |

FOREIGN PATENT DOCUMENTS

JP 2017-174866 A 9/2017

* cited by examiner

*Primary Examiner* — Caridad Everhart
(74) *Attorney, Agent, or Firm* — Foley & Lardner LLP

(57) ABSTRACT

According to one embodiment, a semiconductor storage device includes: a substrate; a plurality of first gate electrodes arranged in a first direction intersecting with a substrate surface; a first semiconductor film extending in the first direction and facing the plurality of first gate electrodes; a first gate insulating film provided between the plurality of first gate electrodes and the first semiconductor film; a second gate electrode disposed farther away from the substrate than the plurality of first gate electrodes; a second semiconductor film that extends in the first direction, faces the second gate electrode, and has, in the first direction, one end connected to the first semiconductor film; and a second gate insulating film provided between the second gate electrode and the second semiconductor film. The second gate electrode includes: a first portion; and a second portion provided between the first portion and the second semiconductor film, and facing the second semiconductor film. At least a portion of the second portion is provided closer to a side of the substrate than a surface of the first portion on the side of the substrate side in the first direction.

7 Claims, 23 Drawing Sheets

SEMICONDUCTOR STORAGE DEVICE

CROSS-REFERENCE TO RELATED APPLICATION

This application is based upon and claims the benefit of priority from Japanese Patent Application No. 2019-039971, filed Mar. 5, 2019, the entire contents of which are incorporated herein by reference.

FIELD

Embodiments described herein relate generally to a semiconductor storage device.

BACKGROUND

A semiconductor storage device is known which includes: a substrate; a plurality of gate electrodes which are arranged in a first direction intersecting with a surface of the substrate; a semiconductor film which extends in the first direction and faces the plurality of gate electrodes; and a gate insulating film which is provided between the plurality of gate electrodes and the semiconductor film.

Examples of related art include JP-A-2017-174866.

DETAILED DESCRIPTION

Figure 1:
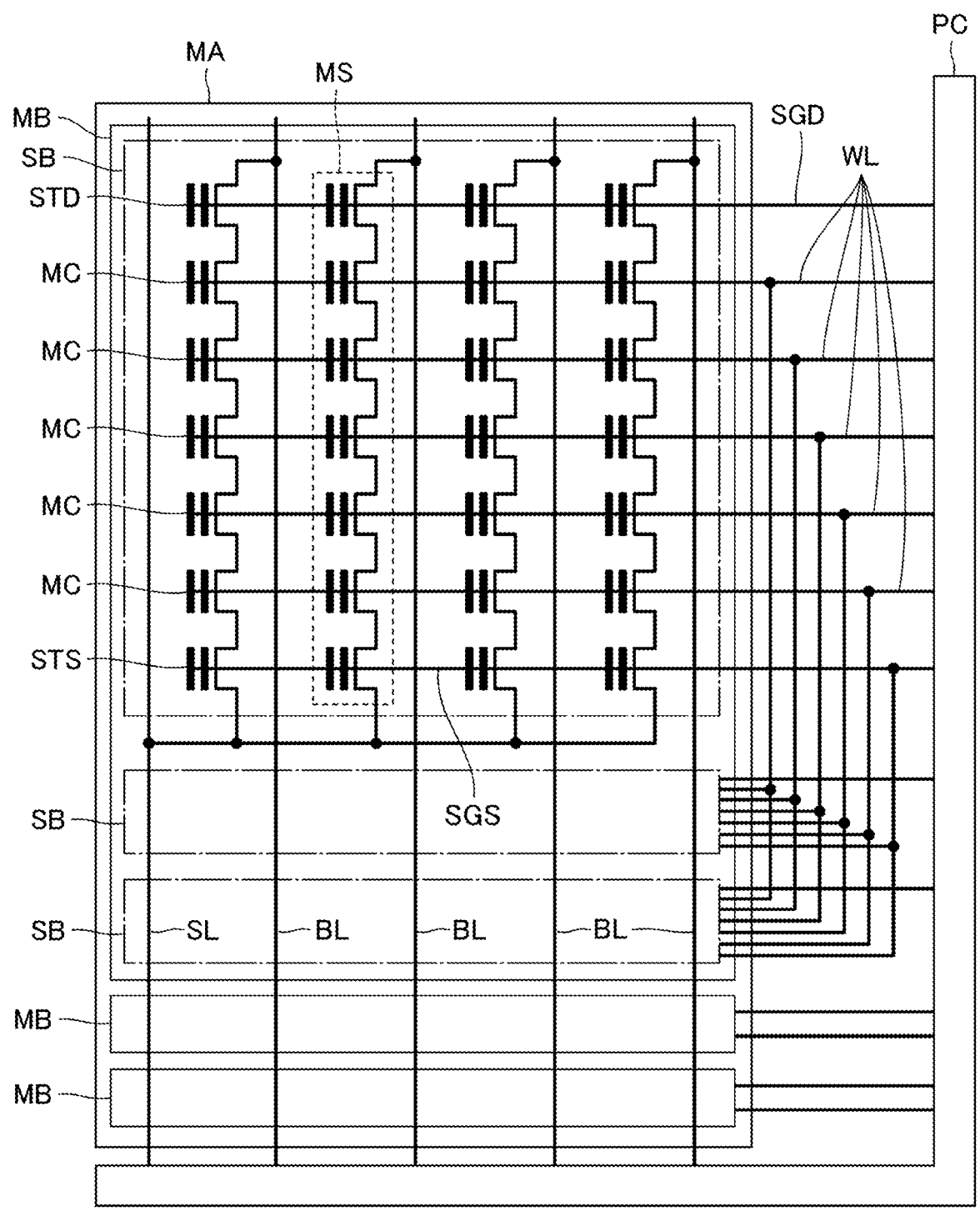
FIG. 1 is a schematic view of an equivalent circuit of a semiconductor storage device according to a first embodiment.

Embodiments provide a semiconductor storage device that may be suitably controlled.

In general, according to one embodiment, the semiconductor storage device includes: a substrate; a plurality of first gate electrodes spaced apart from one another along a first direction perpendicular to a surface of the substrate; a first semiconductor film extending along the first direction and facing the plurality of first gate electrodes; a first gate insulating film provided between the plurality of first gate electrodes and the first semiconductor film; a second gate electrode disposed farther away from the substrate than the plurality of first gate electrodes along the first direction; a second semiconductor film, extending along the first direction, that faces the second gate electrode and includes one end connected to an upper surface of the first semiconductor film; and a second gate insulating film provided between the second gate electrode and the second semiconductor film. The second gate electrode includes: a first portion; and a second portion, provided between the first portion and the second semiconductor film, that faces the second semiconductor film. At least a portion of the second portion is provided closer to the plurality of first gate electrodes than the first portion along the first direction.

Provided is a semiconductor storage device that may be suitably controlled.

Next, the semiconductor storage device according to embodiments will be described in detail with reference to the accompanying drawings. Further, the embodiments are merely examples and are not represented for the purpose of limiting the present disclosure.

In addition, each of the drawings is schematic, and a portion of the configuration and the like may be omitted. Also, common portions in each of the embodiments may be assigned the same reference numerals, and the descriptions thereof may be omitted.

Further, in the present specification, a predetermined direction which is parallel to the surface of a substrate is referred to as an X direction, and a direction which is parallel to the surface of the substrate and perpendicular to the X direction is referred to as a Y direction, and a direction which is perpendicular to the surface of the substrate is referred to as a Z direction.

Further, in the present specification, a direction along a predetermined surface may be referred to as a first direction, a direction intersecting with the first direction along the predetermined surface may be referred to as a second direction, and a direction intersecting with the predetermined surface may be referred to as a third direction. The first direction, the second direction, and the third direction may or may not correspond to any of the X direction, the Y direction, and the Z direction.

Further, in the present specification, terms such as "upper" and "lower" are based on the substrate. For example, a direction which becomes farther away from the substrate along the first direction is referred to as "upper," and a direction which approaches the substrate along the first direction is referred to as "lower." In addition, the lower surface or lower end of a configuration is referred to as the surface or end portion of a substrate of the configuration, and the upper surface or upper end is referred to as the surface or end portion opposite to the substrate of the configuration. Further, a surface intersecting with the second direction or the third direction is referred to as a side surface or the like. Also, the term "height" is referred to a distance extended from the substrate surface in the first direction or the Z direction. Also, the phrase "height difference" is referred to as a distance difference between two heights in the first direction or the Z direction.

Further, in the present specification, when the term "width" or "thickness" in a predetermined direction is referred to for a configuration, a member, etc., such a term means the width or thickness in a cross section, etc. which is observed by a scanning electron microscopy (SEM), a transmission electron microscopy (TEM), or the like.

First Embodiment

[Configuration]

FIG. 1 is a schematic view of an equivalent circuit of a semiconductor storage device according to a first embodiment.

The semiconductor storage device according to the present embodiment includes a memory cell array MA and a peripheral circuit PC that controls the memory cell array MA.

The memory cell array MA includes a plurality of memory blocks MB. Each of the plurality of memory blocks MB includes a plurality of sub blocks SB. Each of the plurality of sub blocks SB includes a plurality of memory strings MS. One end of each of the plurality of memory strings MS is connected to the peripheral circuit PC via a bit line BL. Further, the other ends of the plurality of memory strings MS are respectively connected to the peripheral circuit PC via a common source line SL.

The memory string MS includes a drain select transistor STD, a plurality of memory cells MC, and a source select transistor STS which are connected in series between the bit line BL and the source line SL. Hereinafter, the drain select transistor STD and the source select transistor STS may be simply referred to as select transistors (STD, STS).

The memory cell MC is a field effect transistor that includes a semiconductor film, a gate insulating film, and a gate electrode. The semiconductor film functions as a channel region. The gate insulating film includes a memory unit capable of storing data. The memory unit is, for example, a charge storage film such as a silicon nitride (SiN) film or a floating gate. In this case, a threshold voltage of the memory cell MC changes in accordance with the amount of charge in the charge storage film. The gate electrode is connected to a word line WL. The word lines WL are provided to correspond to a plurality of memory cells MC which belong to one memory string MS, and are commonly connected to all the memory strings MS in one memory block MB.

The select transistor (STD, STS) is a field effect transistor that includes a semiconductor film, a gate insulating film, and a gate electrode. The semiconductor film functions as a channel region. The gate electrode of the drain select transistor STD is connected to a drain select line SGD. The drain select line SGD is provided to correspond to a sub block SB, and is commonly connected to all drain select transistors STD in one sub block SB. The gate electrode of the source select transistor STS is connected to a source select line SGS. The source select line SGS is commonly connected to all the source select transistors STS in one memory block MB.

The peripheral circuit PC generates, for example, voltages necessary for a read operation, a write operation, and an erase operation, and applies the voltages to the bit line BL, the source line SL, the word line WL, and the select gate lines (SGD, SGS). The peripheral circuit PC includes, for example, a plurality of transistors and wirings which are provided on the same chip as that of the memory cell array MA.

Figure 2:
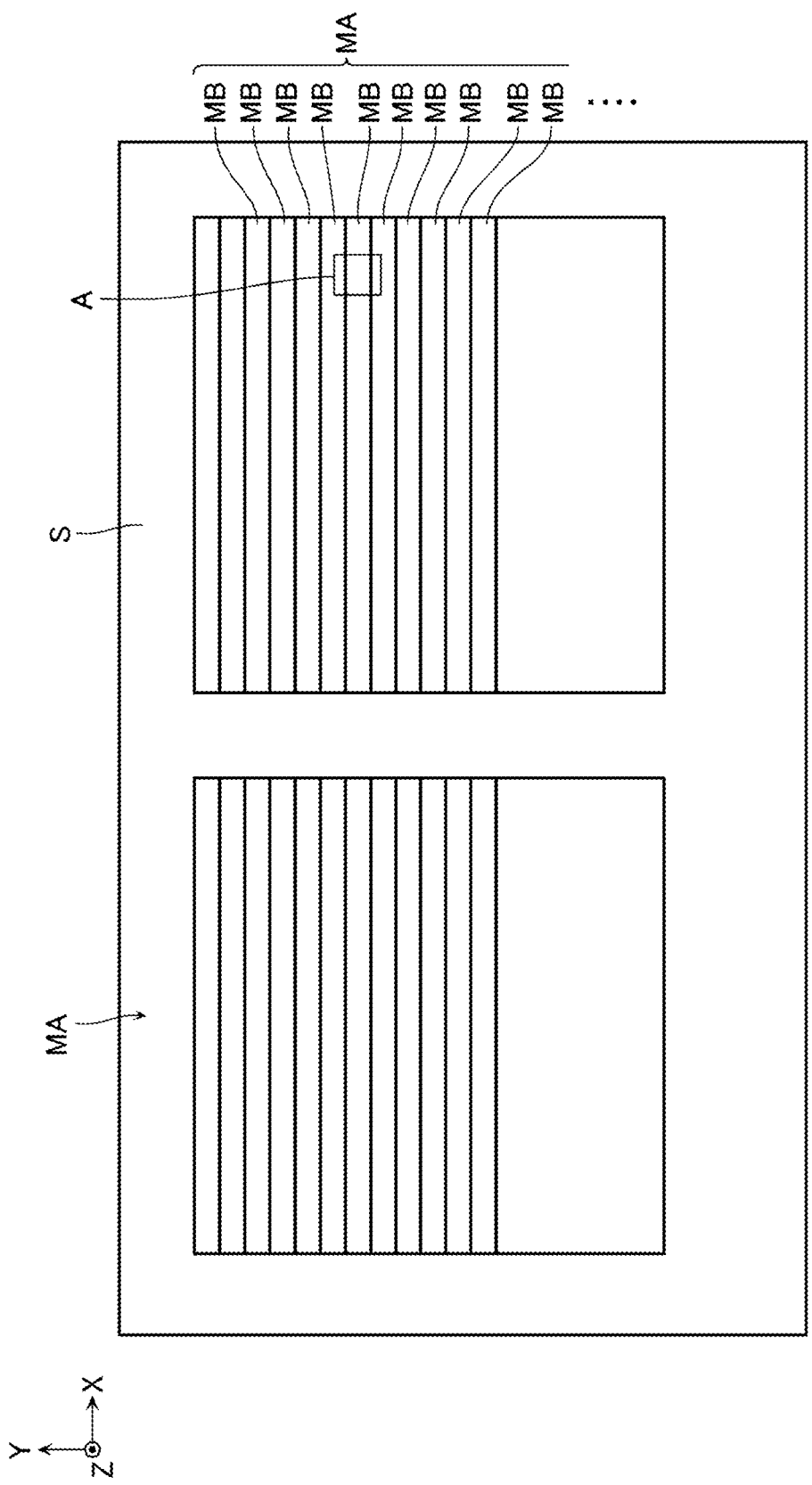
FIG. 2 is a schematic plan view illustrating a portion of the configuration of the semiconductor storage device.
Figure 3:
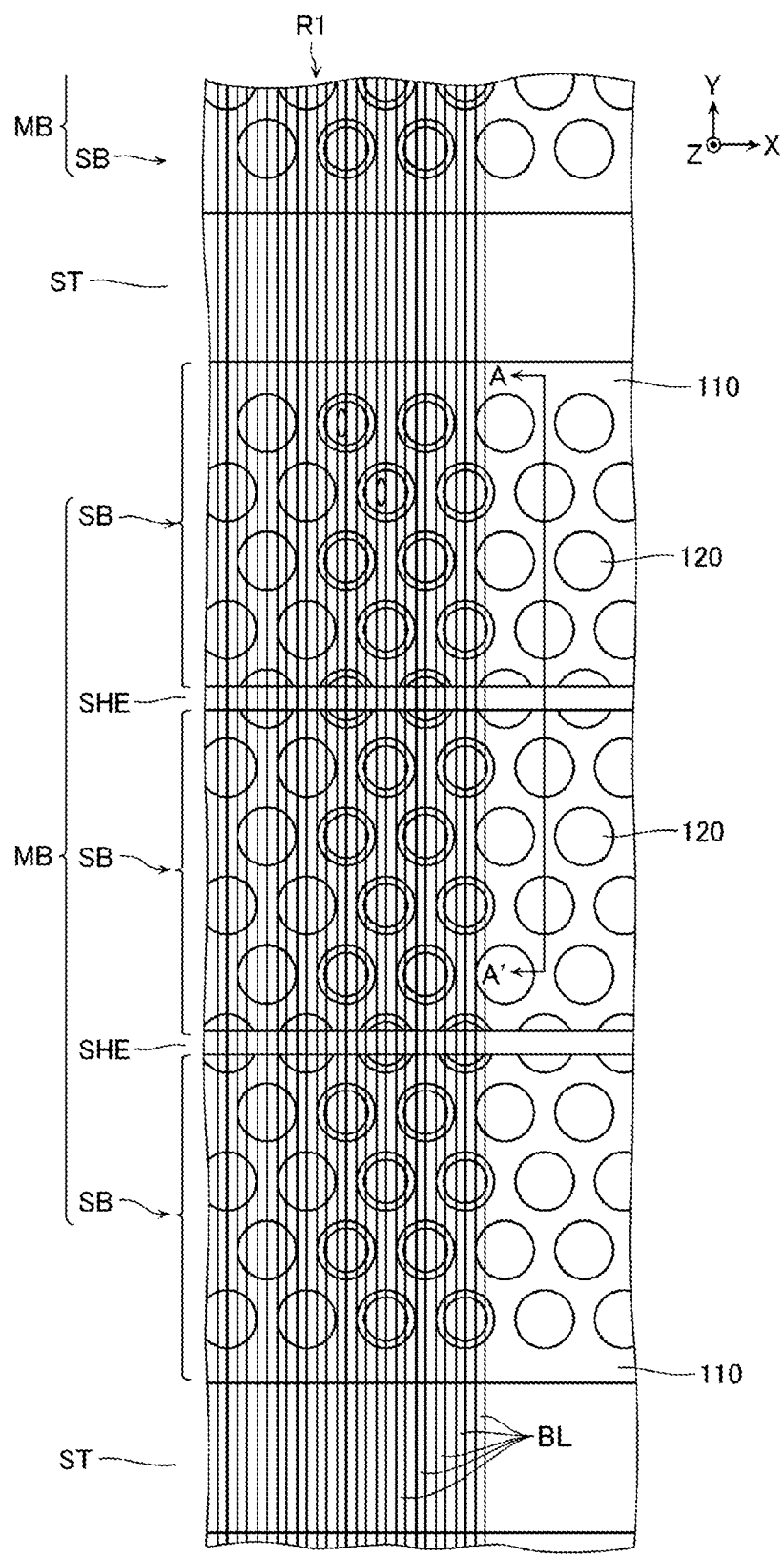
FIG. 3 is a schematic plan view illustrating a portion of the configuration of the semiconductor storage device.

Next, a configuration example of the semiconductor storage device according to the present embodiment will be described with reference to FIG. 2. FIG. 2 is a schematic plan view of the semiconductor storage device according to the present embodiment. FIG. 3 is a schematic enlarged view of a portion indicated by the symbol "A" of FIG. 2.

As illustrated in FIG. 2, the semiconductor storage device according to the present embodiment includes a substrate S. The substrate S is, for example, a semiconductor substrate made of single crystal silicon (Si) or the like.

The substrate S is provided with two memory cell arrays MA aligned in the X direction. Each memory cell array MA includes a plurality of memory blocks MB aligned in the Y direction.

As illustrated in FIG. 3, the memory block MB includes three sub blocks SB which are aligned in the Y direction, and an insulating portion SHE between the sub blocks which are provided between two adjacent sub blocks SB in the Y direction. The drain select lines SGD in these two sub blocks SB (FIG. 1) are electrically isolated via the insulating portion SHE.

An insulating layer ST between the blocks extending in the X direction is provided between the memory blocks MB which are adjacent in the Y direction. The word lines WL in these two memory blocks MB (FIG. 1) are electrically isolated via the insulating layer ST.

Figure 4:
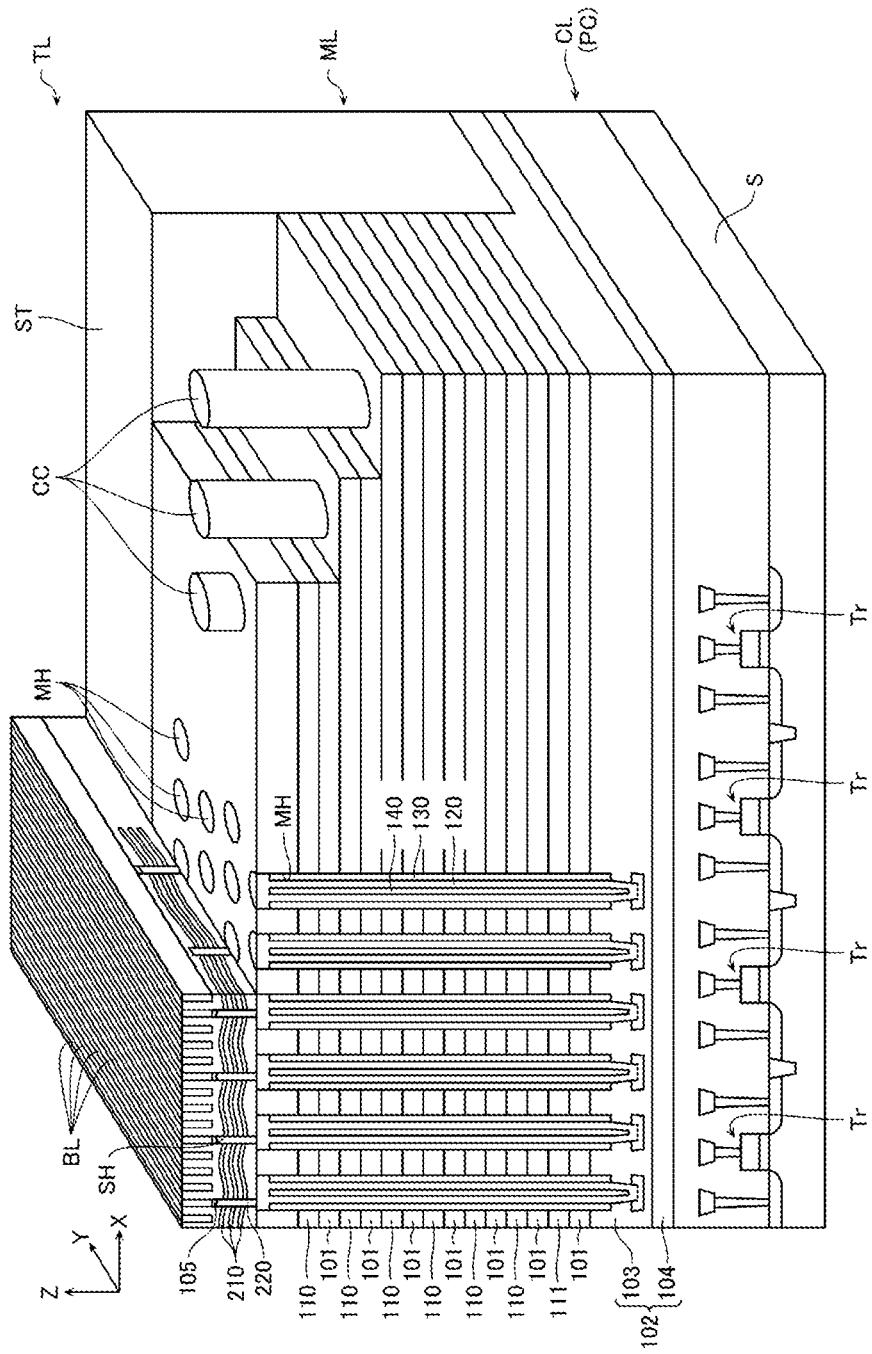
FIG. 4 is a schematic perspective view illustrating a portion of the configuration of the semiconductor storage device.
Figure 5:
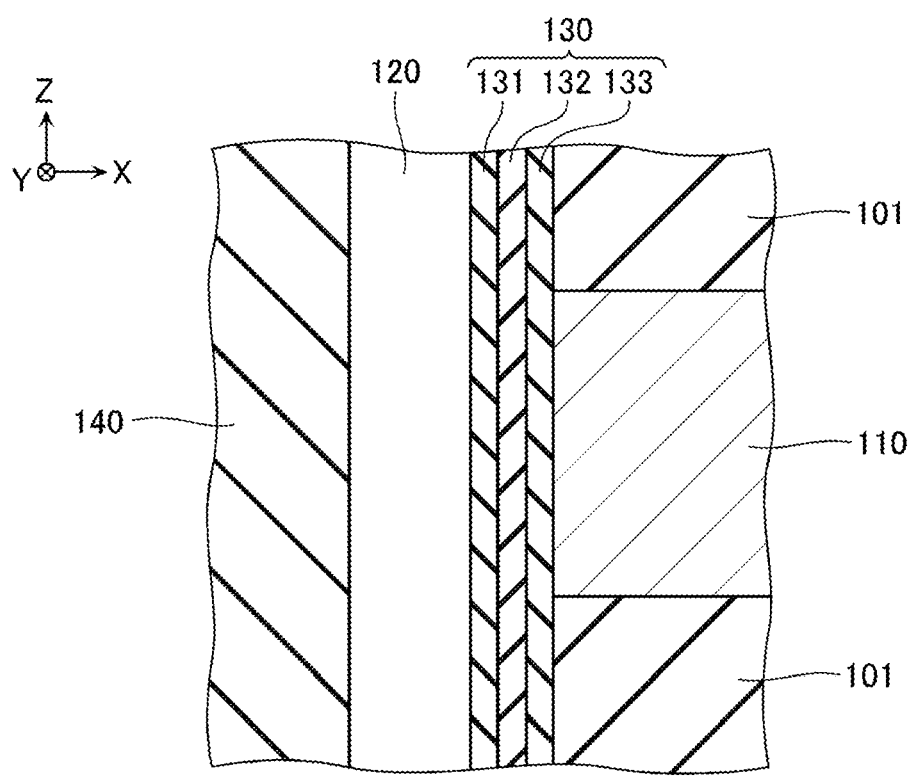
FIG. 5 is a schematic cross-sectional view illustrating a portion of the configuration of the semiconductor storage device.
Figure 6:
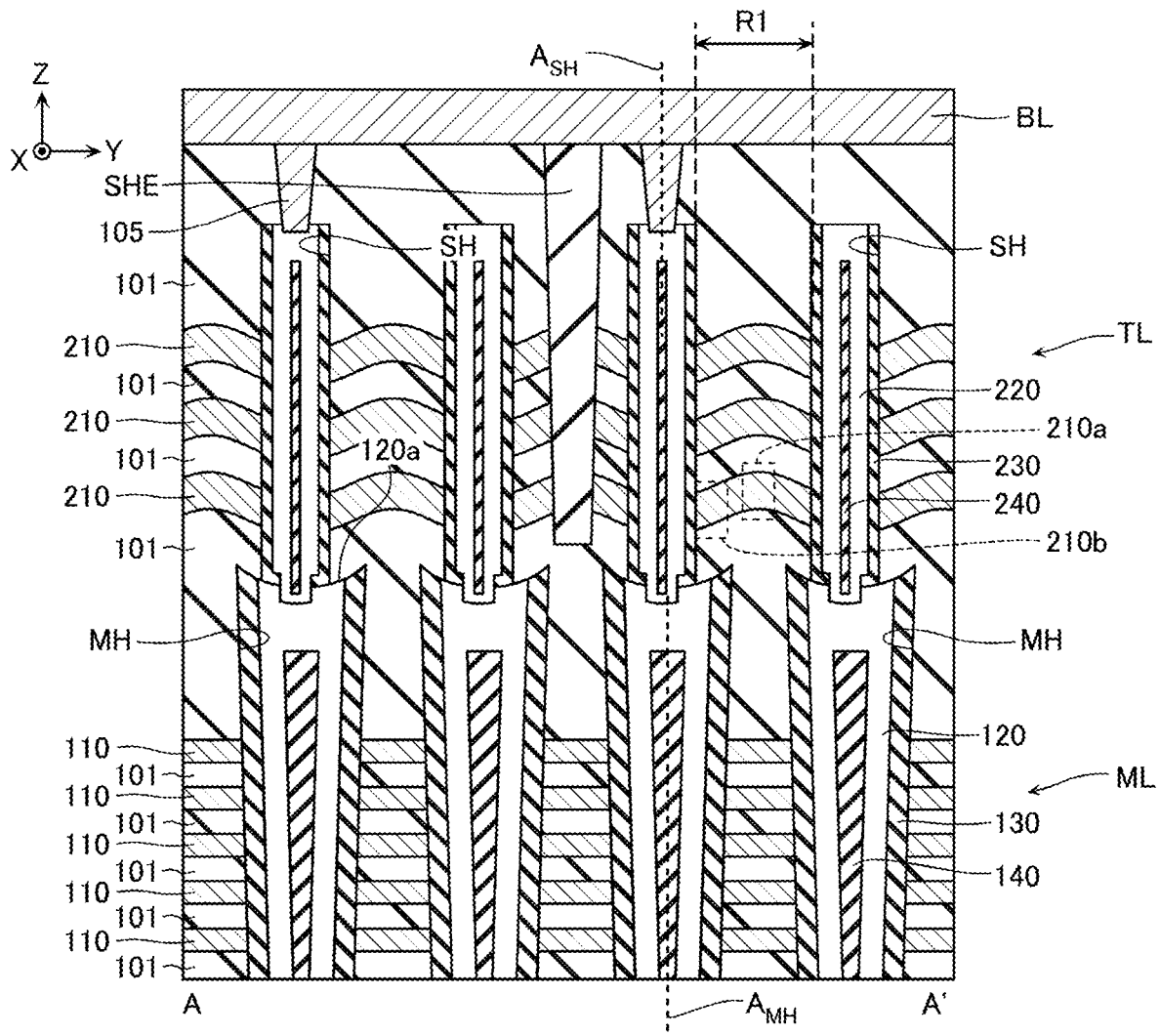
FIG. 6 is a schematic cross-sectional view illustrating a portion of the configuration of the semiconductor storage device.

FIG. 4 is a schematic perspective view of the semiconductor storage device according to the present embodiment. FIG. 5 is an XZ cross-sectional view of a portion of the configuration of FIG. 4, and FIG. 6 is a YZ cross-sectional view of a portion of the configuration of FIG. 4. For convenience of explanation, a portion of the configurations is omitted in FIGS. 4, 5, and 6.

As illustrated in FIG. 4, the semiconductor storage device according to the present embodiment includes the substrate S, a circuit layer CL provided above the substrate S, a memory layer ML provided above the circuit layer CL, and a transistor layer TL provided above the memory layer ML.

The substrate S is, for example, a semiconductor substrate made of single crystal silicon (Si) or the like. The substrate S has, for example, a double well structure that includes an n-type impurity layer on the surface of a semiconductor substrate and further includes a p-type impurity layer in the n-type impurity layer.

The circuit layer CL includes a plurality of transistors Tr constituting the peripheral circuit PC (FIG. 1), and a plurality of wirings and contacts connected to the plurality of transistors Tr. The transistor Tr is, for example, a field effect transistor that uses the surface of the substrate S as a channel region.

The memory layer ML includes a plurality of conductive films 110 arranged in the Z direction, a plurality of semiconductor films 120 which extend in the Z direction and face the plurality of conductive films 110, and a gate insulating film 130 which is provided between the conductive films 110 and the semiconductor film 120.

The conductive film 110 is, for example, a conductive film made of tungsten (W) or the like, and functions as a word line WL (FIG. 1) and a gate electrode of each of the plurality of memory cells MC connected to the word line WL. Further, the conductive film 111 and the conductive film 102 are provided below the plurality of conductive films 110. The conductive film 111 is, for example, a conductive film made of polycrystalline silicon (p-Si) into which an n-type impurity such as phosphorus (P) is implanted, and functions as the source select line SGS (FIG. 1) and a gate electrode of each of the plurality of source select transistors STS which are connected to the source select line SGS (FIG. 1).

The conductive film 102 functions as a source line SL (FIG. 1). In addition, an interlayer insulating film 101 such as silicon oxide ($SiO_2$) is provided among the conductive films 110, 111, and 102.

The conductive films 110 and 111 include a plurality of through via holes MH formed in a predetermined pattern, and the semiconductor film 120 and the gate insulating film 130 are disposed inside the through via holes MH. The end of the conductive film 110 in the X direction is connected to the contact CC extending in the Z direction.

The conductive film 102 includes a semiconductor film 103 connected to the semiconductor film 120 and a conductive film 104 provided on the lower surface of the semiconductor film 103. The semiconductor film 103 is, for example, a conductive semiconductor film made of polycrystalline silicon or the like into which an n-type impurity such as phosphorus is implanted. The conductive film 104 is, for example, a conductive film made of polycrystalline silicon into which an n-type impurity such as phosphorus is implanted, a metal such as tungsten (W), silicide, or the like.

The semiconductor film 120 faces the plurality of conductive films 110 and 111, and functions as a channel region or the like of the plurality of memory cells MC and the source select transistor STS which are arranged in the Z direction. The semiconductor film 120 has a substantially cylindrical shape which extends in the Z direction, and an insulating film 140 such as silicon oxide is embedded in the central portion. Further, the semiconductor film 120 is connected to the semiconductor film 103 at the lower end portion. The semiconductor film 120 is, for example, a semiconductor film such as polycrystalline silicon. Meanwhile, as illustrated in FIG. 6, a concave portion 120a is provided on the upper surface of the semiconductor film 120 according to the present embodiment. The concave portion 120a is, for example, a substantially spherical concave portion in which the upper surface has a shorter height as it approaches a central axis $A_{MH}$ of the through via hole MH.

The gate insulating film 130 has a substantially cylindrical shape which extends in the Z direction along an outer peripheral surface of the semiconductor film 120. As illustrated in FIG. 5, the gate insulating film 130 includes a tunnel insulating film 131, a charge storage film 132, and a block insulating film 133 which are stacked on the outer peripheral surface of the semiconductor film 120. The tunnel insulating film 131 and the block insulating film 133 are, for example, insulating films made of silicon oxide or the like. The charge storage film 132 is, for example, a film capable of storing charges such as silicon nitride ($Si_3N_4$).

As illustrated in FIG. 6, the transistor layer TL includes a plurality of conductive films 210 which are arranged in the Z direction, a plurality of semiconductor films 220 which extend in the Z direction and face the plurality of conductive films 210, and a gate insulating film 230 which is provided between the conductive films 210 and the semiconductor film 220.

The conductive film 210 is, for example, a conductive film made of tungsten or the like, and functions as the drain select line SGD (FIG. 1) and a gate electrode of each of a plurality of drain select transistors STD which are connected to the drain select line SGD (FIG. 1). The plurality of conductive films 210 are provided in the Z direction via the interlayer insulating film 101. Further, the width of the conductive film 210 in the Y direction is shorter than half the width of the conductive film 110 in the Y direction, and an insulating portion SHE such as silicon oxide is provided between the adjacent conductive films 210 in the Y direction.

The conductive film 210 has a plurality of through via holes SH formed in a predetermined pattern, and the semiconductor film 220 and the gate insulating film 230 are disposed inside the through via holes SH.

In addition, an unevenness is provided on the upper and lower surfaces of the conductive film 210. That is, the heights of the upper and lower surfaces of the conductive film 210 change substantially periodically to correspond to the arrangement period of the plurality of through via holes MH in the XY plane. The heights of the upper and lower surfaces of the conductive film 210 are shorter at portions closer to the central axis $A_{MH}$ of the through via holes MH in the XY plane. Therefore, for example, when viewed in a predetermined XZ cross section or YZ cross section, the conductive film 210 includes a plurality of convex portions 210a and concave portions 210b which are alternately provided in the X direction or Y direction to correspond to the through via holes MH. The convex portions 210a are provided near the middle of the through via holes MH, which are adjacent to each other in the Y direction or the X direction. Each of the convex portions 210a includes a portion where the upper and lower surfaces of the conductive film 210 are the highest in each of the conductive film 210 in a range R1 between two adjacent through via holes SH in the Y direction or the X direction. The concave portions 210b are provided near the through via holes MH. Each of the concave portions 210b includes a portion where the upper and lower surfaces of the conductive film 210 are the lowest in each of the conductive film 210 in the range R1. Further, the concave portions 210b are connected to the gate insulating film 230 and face the semiconductor film 220.

Figure 25:
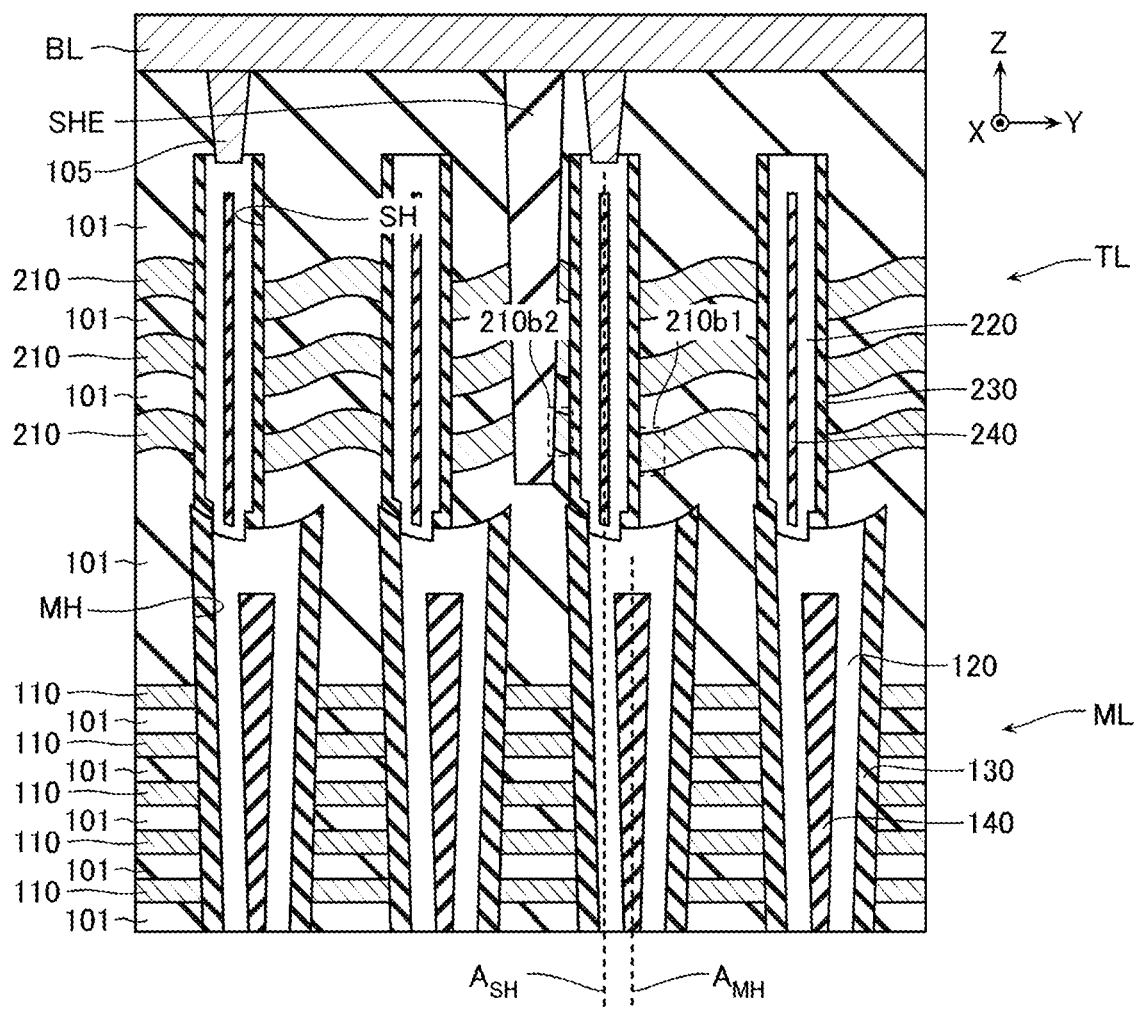
FIG. 25 is a schematic cross-sectional view illustrating a portion of the configuration of the semiconductor storage device according to the first embodiment.

Meanwhile, as will be described in detail later, the central axis $A_{MH}$ of the through via hole MH and a central axis $A_{SH}$ of the through via hole SH may be misaligned in the XY plane. For example, FIG. 25 illustrates a configuration in which the central axis $A_{SH}$ of the through via hole SH is misaligned to the left in the YZ cross section with respect to the central axis $A_{MH}$ of the through via hole MH. Here, as described above, the upper and lower surfaces of the conductive film 210 are provided with unevenness in which the height is shorter at portions closer to the central axis $A_{MH}$ of the through via hole MH in the XY plane. Therefore, for example, focusing on a predetermined XZ cross section or YZ cross section, assuming that a concave portion 210b which faces one side of the semiconductor film 220 in the X direction or Y direction (e.g., the right side in FIG. 25) is a concave portion (or facing portion) 210b1, and a concave portion 210b which faces the other side of the semiconductor film 220 in the X direction or Y direction (e.g., the left side in FIG. 25) is a concave portion (or facing portion) 210b2, the upper and lower surfaces of the concave portion 210b1 are located below the upper and lower surfaces of the concave portion 210b2, respectively.

The semiconductor film 220 faces the plurality of conductive films 210 as illustrated in FIG. 6, and functions as a channel region or the like of the drain select transistor STD. The semiconductor film 220 has a substantially cylindrical shape which extends in the Z direction, and an insulating film 240 such as silicon oxide is embedded in the central portion. Further, the semiconductor film 220 is connected to the semiconductor film 120 at the lower end. Further, the semiconductor film 220 is connected to a contact 105 at the upper end, and is connected to the bit line BL via the contact 105. The semiconductor film 220 is, for example, a semiconductor film made of polycrystalline silicon or the like into which a p-type impurity such as boron (B) is implanted.

Meanwhile, the semiconductor film 220 according to the present embodiment is shorter than the semiconductor film 120. That is, the width of the semiconductor film 220 in the Z direction is shorter than the width of the semiconductor film 120 in the Z direction. Further, the semiconductor film 220 and the semiconductor film 120 may be formed in a substantially tapered shape. In such a case, the largest outer diameter of the semiconductor film 220 may be shorter than the smallest outer diameter of the semiconductor film 120. In addition, the outer diameter of the lower end portion of the semiconductor film 220 is shorter than the outer diameter of the upper end portion of the semiconductor film 120. However, for example, the outer diameter of the semiconductor film 120 and the outer diameter of the semiconductor film 220 may be set to approximately the same size.

The gate insulating film 230 has a substantially cylindrical shape which extends in the Z direction along the outer peripheral surface of the semiconductor film 220. The gate insulating film 230 may be a single layer film such as silicon oxide, or may be a stacked film, etc. that includes an insulating film of silicon oxide and an insulating film of silicon nitride.

[Manufacturing Method]

Next, a method of manufacturing the semiconductor storage device according to the present embodiment will be described with reference to FIGS. 7 to 23.

In the same manufacturing method, the circuit layer CL described with reference to FIG. 4 and a conductive film used to form the conductive film 102, etc. are formed on the substrate S.

Figure 7:
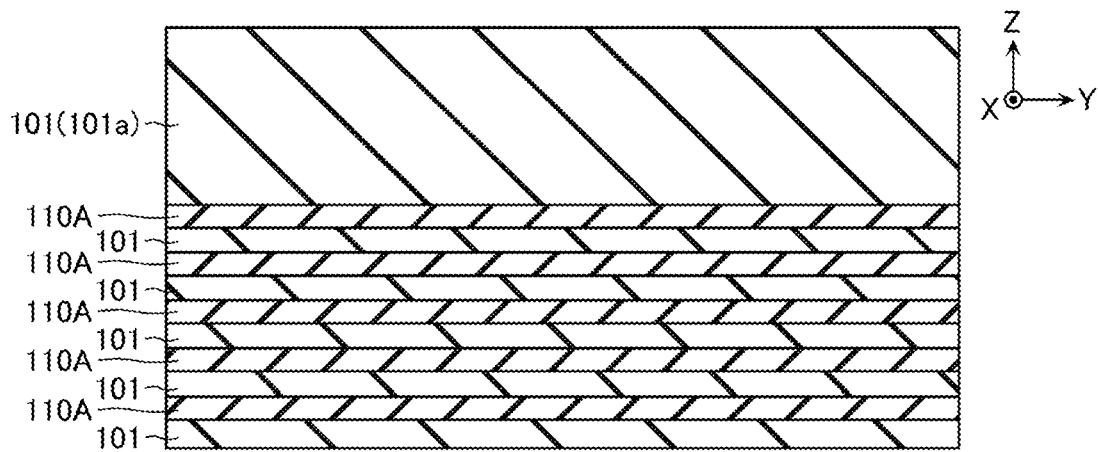
FIG. 7 is a schematic cross-sectional view illustrating a method of manufacturing the semiconductor storage device according to the first embodiment.

Next, as illustrated in FIG. 7, a plurality of interlayer insulating films 101 and a sacrificial film 110A made of silicon nitride or the like are alternately formed above this structure. This step is performed by, for example, a method such as a chemical vapor deposition (CVD).

Figure 8:
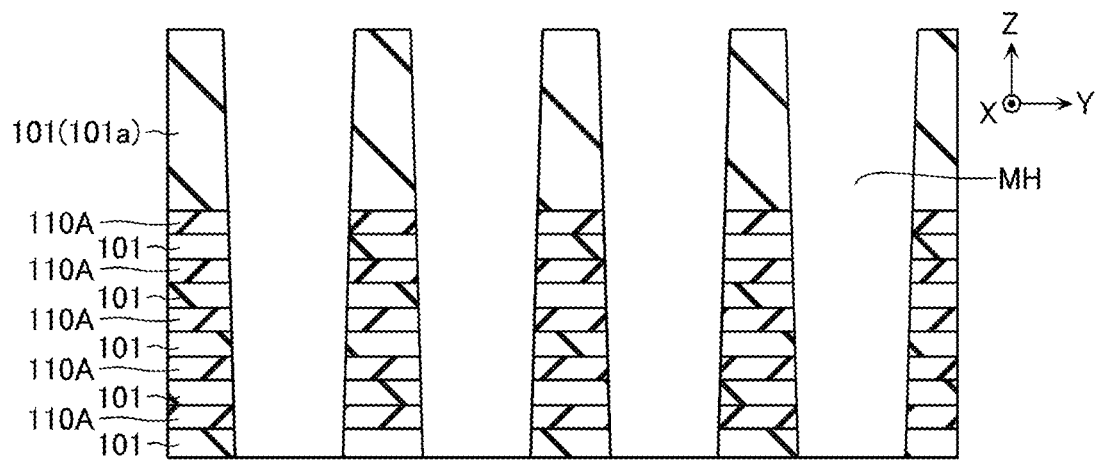
FIG. 8 is a schematic cross-sectional view illustrating the manufacturing method.

Next, the through via holes MH are formed as illustrated in FIG. 8. The through via hole MH extends in the Z direction and penetrates the sacrificial film 110A and the interlayer insulating film 101. This step is performed by, for example, a method such as a reactive ion etching (RIE).

Figure 9:
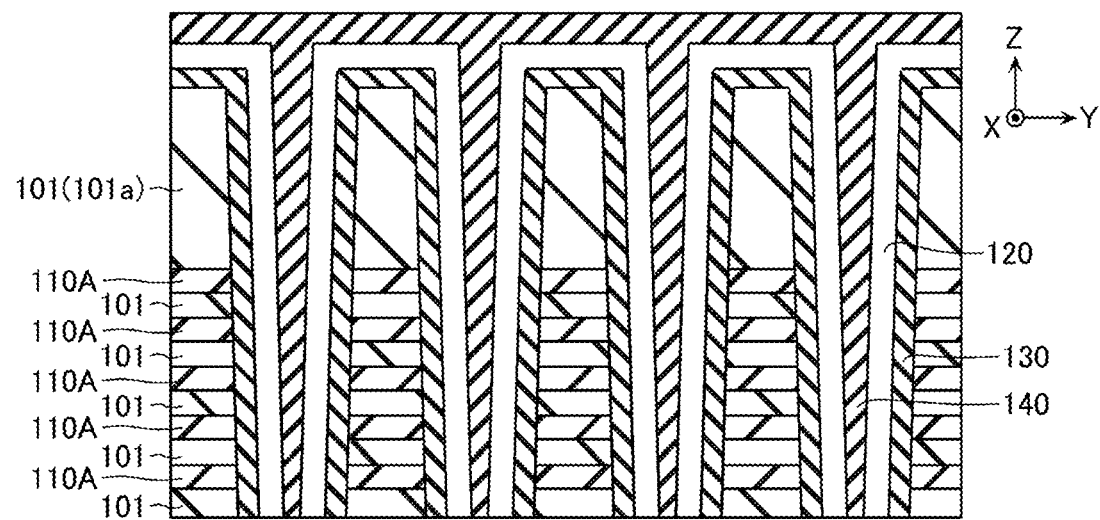
FIG. 9 is a schematic cross-sectional view illustrating the manufacturing method.

Next, as illustrated in FIG. 9, the gate insulating film 130, the semiconductor film 120, and the insulating film 140 are formed on the upper surface of an interlayer insulating film 101a located in the uppermost layer and the inner peripheral surface of the through via hole MH. This step is performed by, for example, a method such as the CVD.

Figure 10:
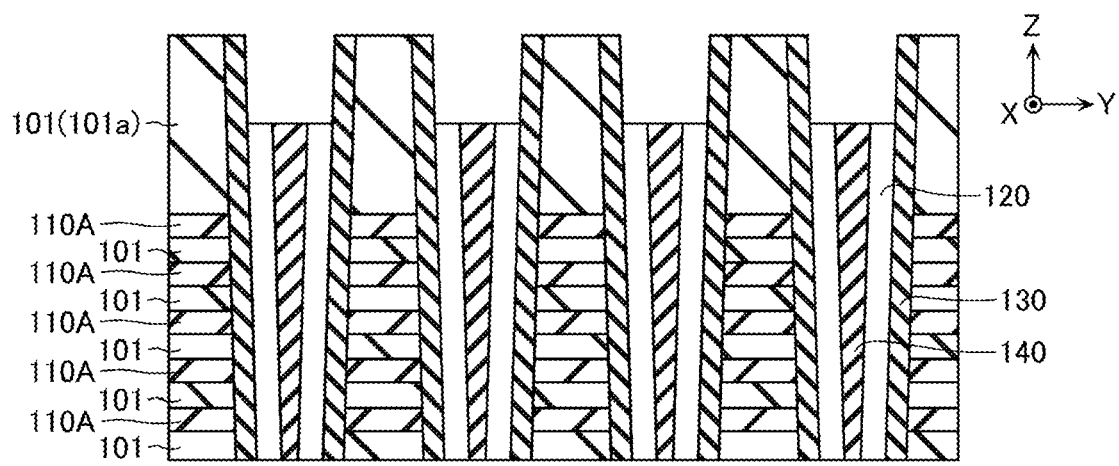
FIG. 10 is a schematic cross-sectional view illustrating the manufacturing method.

Next, as illustrated in FIG. 10, a portion of the gate insulating film 130, a portion of the semiconductor film 120, and a portion of the insulating film 140 are removed. As a result, the upper surface of the interlayer insulating film 101a is exposed. Further, the height of the upper surface of the semiconductor film 120 is set to be lower than the height of the upper surface of the interlayer insulating film 101a. This step is performed by, for example, a method such as the RIE.

Figure 11:
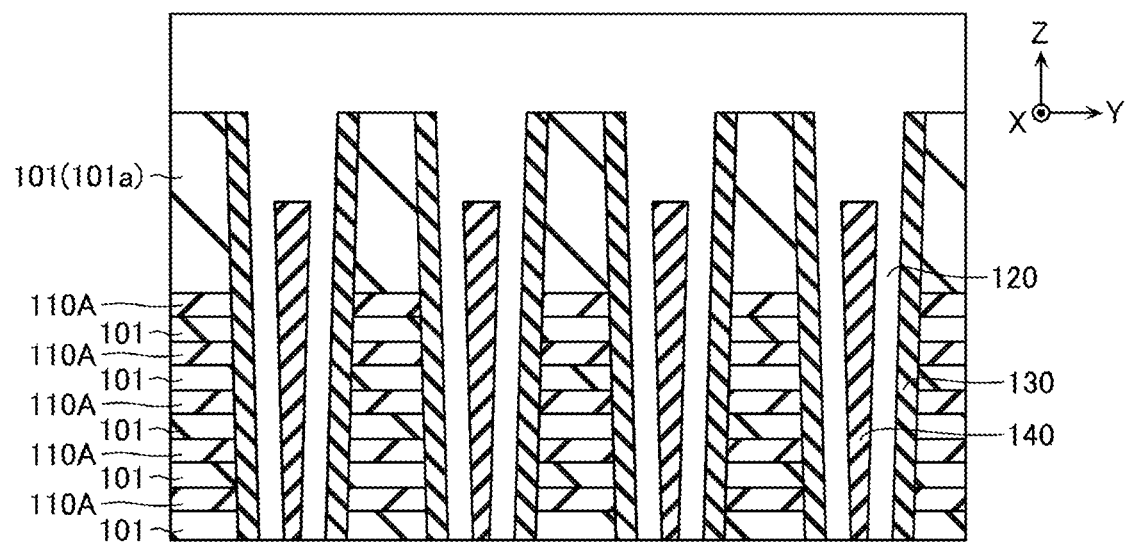
FIG. 11 is a schematic cross-sectional view illustrating the manufacturing method.

Next, as illustrated in FIG. 11, a semiconductor film 120 is further formed on the upper surface of the interlayer insulating film 101a and the upper surface of the semiconductor film 120. This step is performed by, for example, a method such as the CVD.

Figure 12:
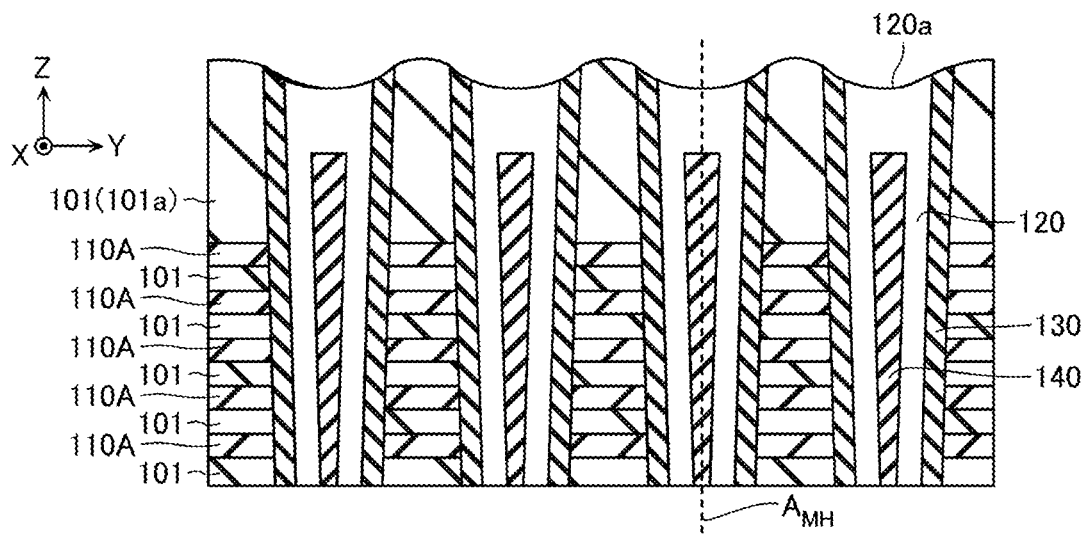
FIG. 12 is a schematic cross-sectional view illustrating the manufacturing method.

Next, as illustrated in FIG. 12, a portion of the semiconductor film 120 is removed. As a result, the upper surface of the interlayer insulating film 101a is exposed. Further, in this step, the upper surfaces of the semiconductor film 120 and the interlayer insulating film 101a are provided with unevenness in which the height is shorter at portions closer to the central axis $A_{MH}$ of the through via hole MH in the XY plane. This step is performed by, for example, a method such as the RIE.

Figure 13:
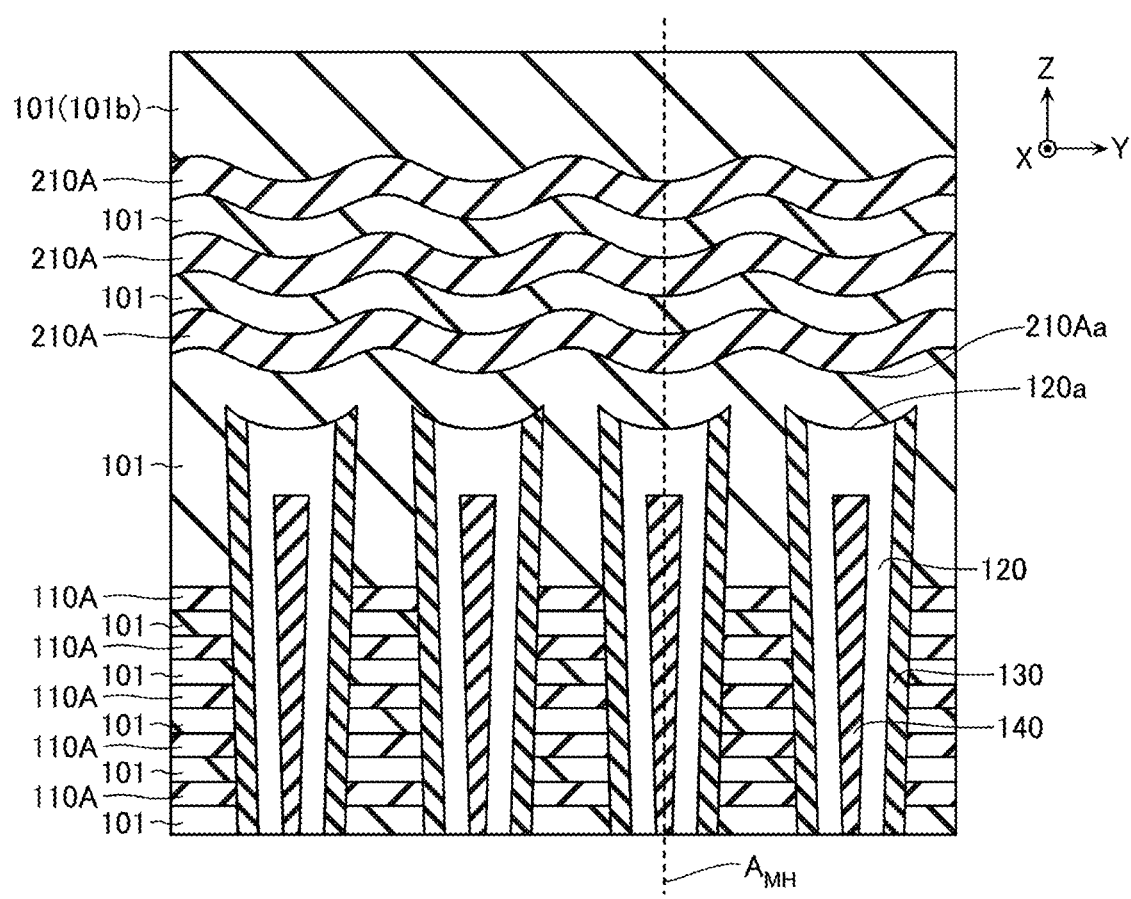
FIG. 13 is a schematic cross-sectional view illustrating the manufacturing method.

Next, as illustrated in FIG. 13, a plurality of interlayer insulating films 101 and a sacrificial film 210A made of silicon nitride or the like are alternately formed on the upper surface of this structure. In the present embodiment, the plurality of interlayer insulating films 101 and the sacrificial film 210A made of silicon nitride or the like are formed along the unevenness on the upper surfaces of the semiconductor film 120 and the interlayer insulating film 101a described with reference to FIG. 12. Therefore, on the lower surfaces of the plurality of interlayer insulating films 101 and the sacrificial film 210A made of silicon nitride or the like, a substantially spherical convex portion 210Aa in which the height is shorter at portions closer to the central axis $A_{MH}$ of the through via hole MH is formed to correspond to the concave portion 120a on the upper surface of the semiconductor film 120. This step is performed by, for example, a method such as the CVD.

Figure 14:
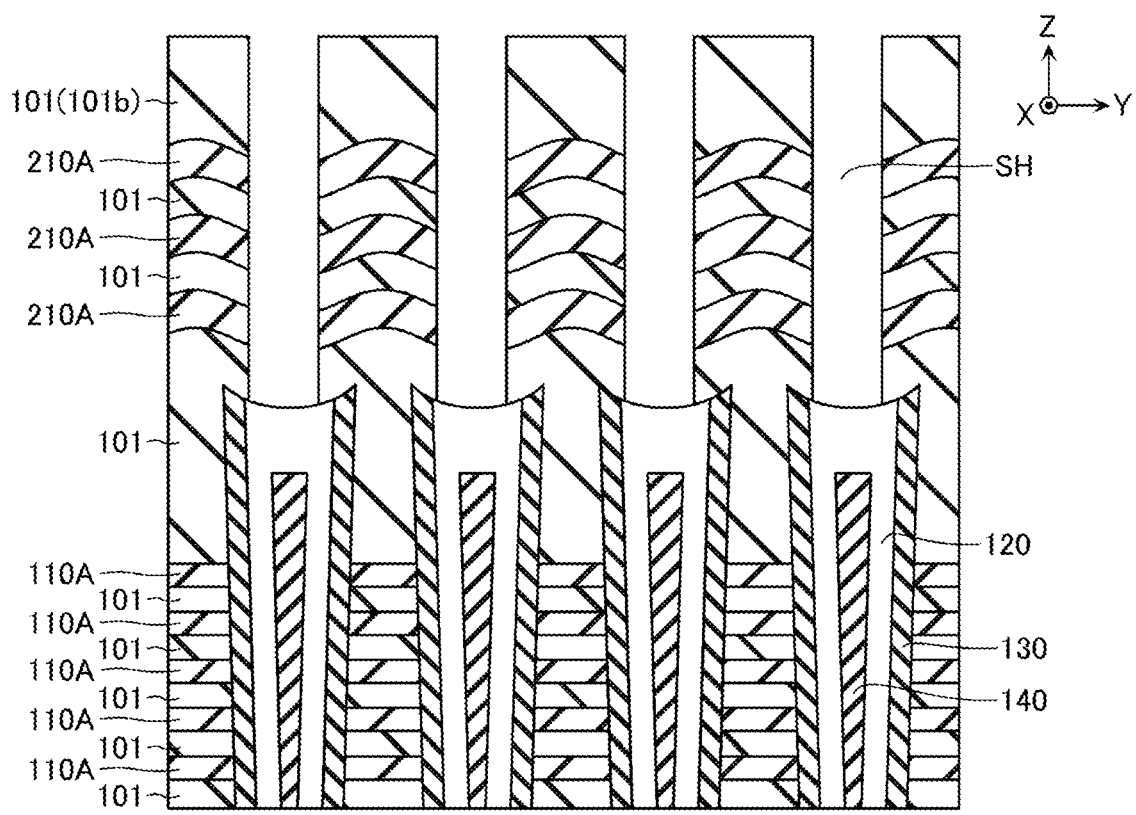
FIG. 14 is a schematic cross-sectional view illustrating the manufacturing method.

Next, as illustrated in FIG. 14, the through via holes SH are formed. The through via hole SH is a through via hole which extends in the Z direction and penetrates the sacrificial film 210A and the interlayer insulating film 101 to expose the semiconductor film 120. This step is performed by, for example, a method such as the RIE.

Figure 15:
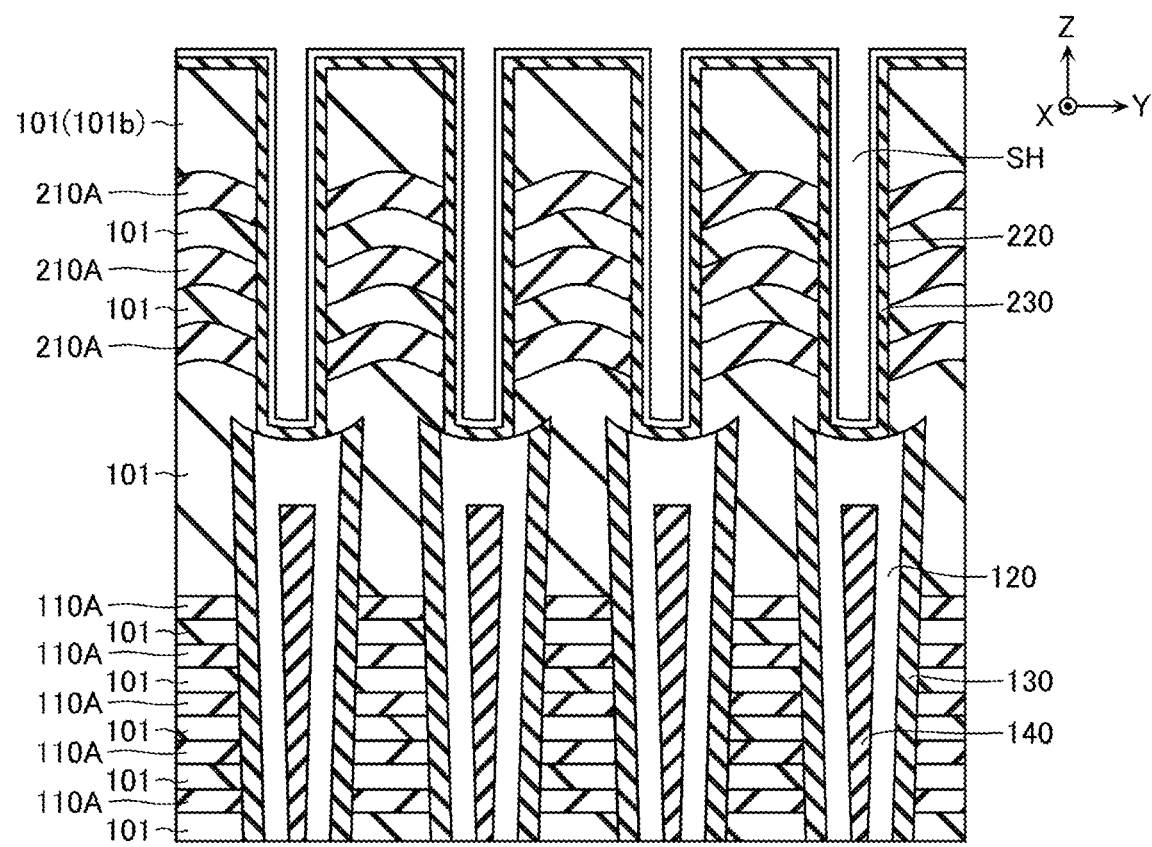
FIG. 15 is a schematic cross-sectional view illustrating the manufacturing method.

Next, as illustrated in FIG. 15, the gate insulating film 230 and a portion of the semiconductor film 220 are formed on the upper surface of an interlayer insulating film 101b located in the uppermost layer, the inner peripheral surface of the through via hole SH, and the upper surface of the semiconductor film 120. This step is performed by, for example, a method such as the CVD. In this case, for example, when forming the semiconductor film 220, a gas that forms a silicon and a gas that forms an impurity such as boron may be used at the same time.

Figure 16:
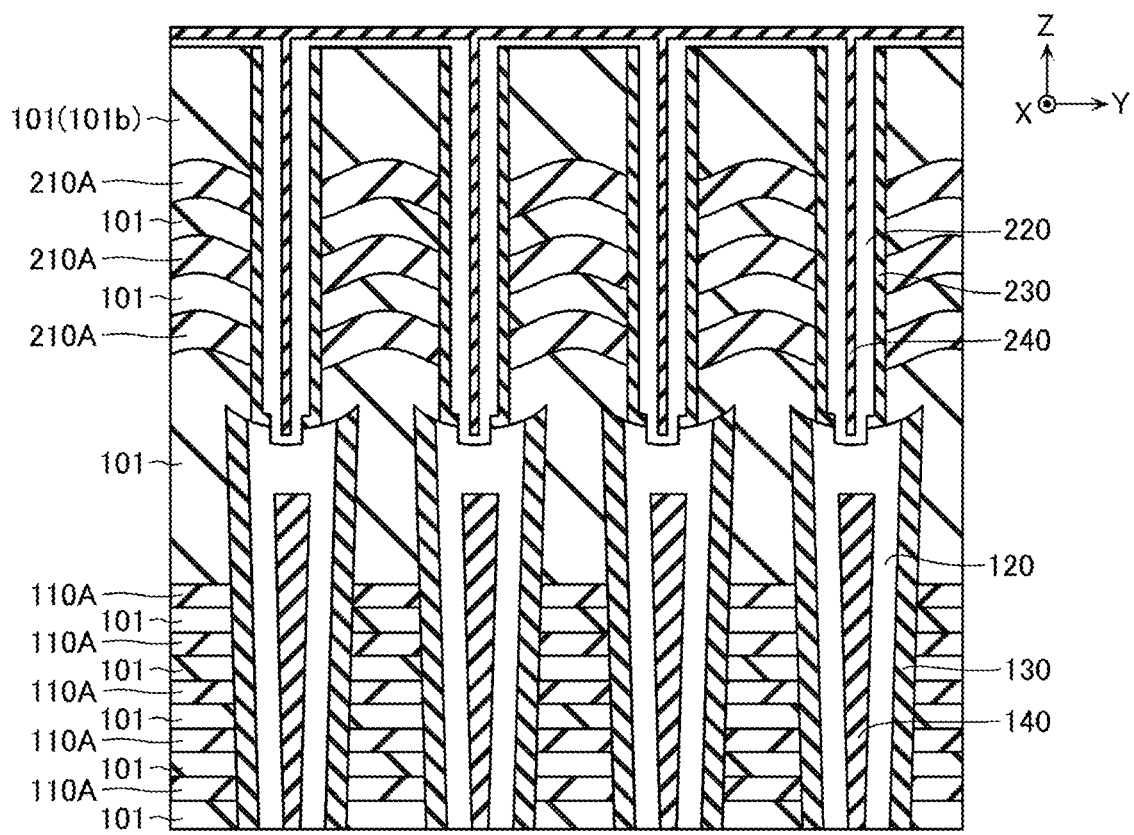
FIG. 16 is a schematic cross-sectional view illustrating the manufacturing method.

Next, as illustrated in FIG. 16, a portion of the semiconductor film 220 and the insulating film 240 are formed on the upper surface of the interlayer insulating film 101b, the inner peripheral surface of the through via hole SH, and the upper surface of the semiconductor film 120. In this step, of the semiconductor film 220 and the gate insulating film 230, a portion provided on the upper surface of the semiconductor film 120 and a portion provided on the upper surface of the interlayer insulating film 101b are removed by, for example, a method such as the RIE. Next, the semiconductor film 220 and the insulating film 240 are formed by, for example, a method such as the CVD.

Figure 17:
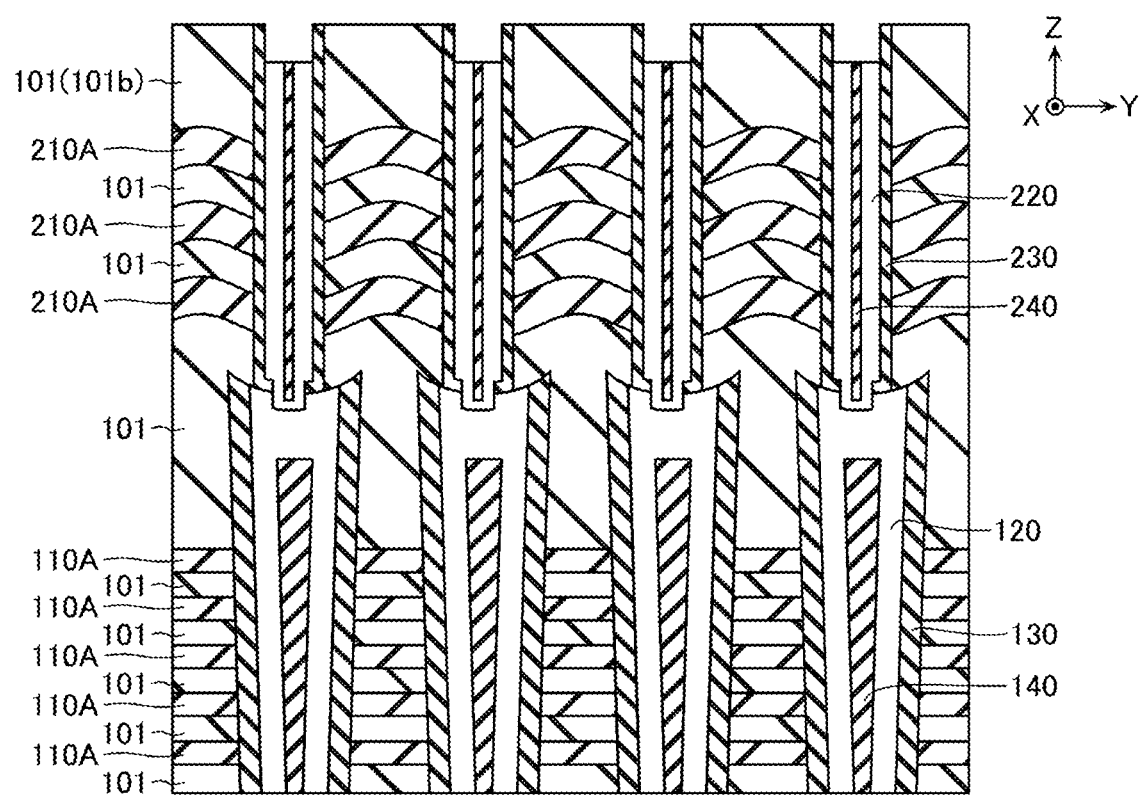
FIG. 17 is a schematic cross-sectional view illustrating the manufacturing method.

Next, as illustrated in FIG. 17, a portion of the semiconductor film 220 and a portion of the insulating film 240 are removed. As a result, the upper surface of the interlayer insulating film 101b is exposed. Further, the height of the upper surface of the semiconductor film 220 is set to be lower than the height of the upper surface of the interlayer insulating film 101b. This step is performed by, for example, a method such as the RIE.

Figure 18:
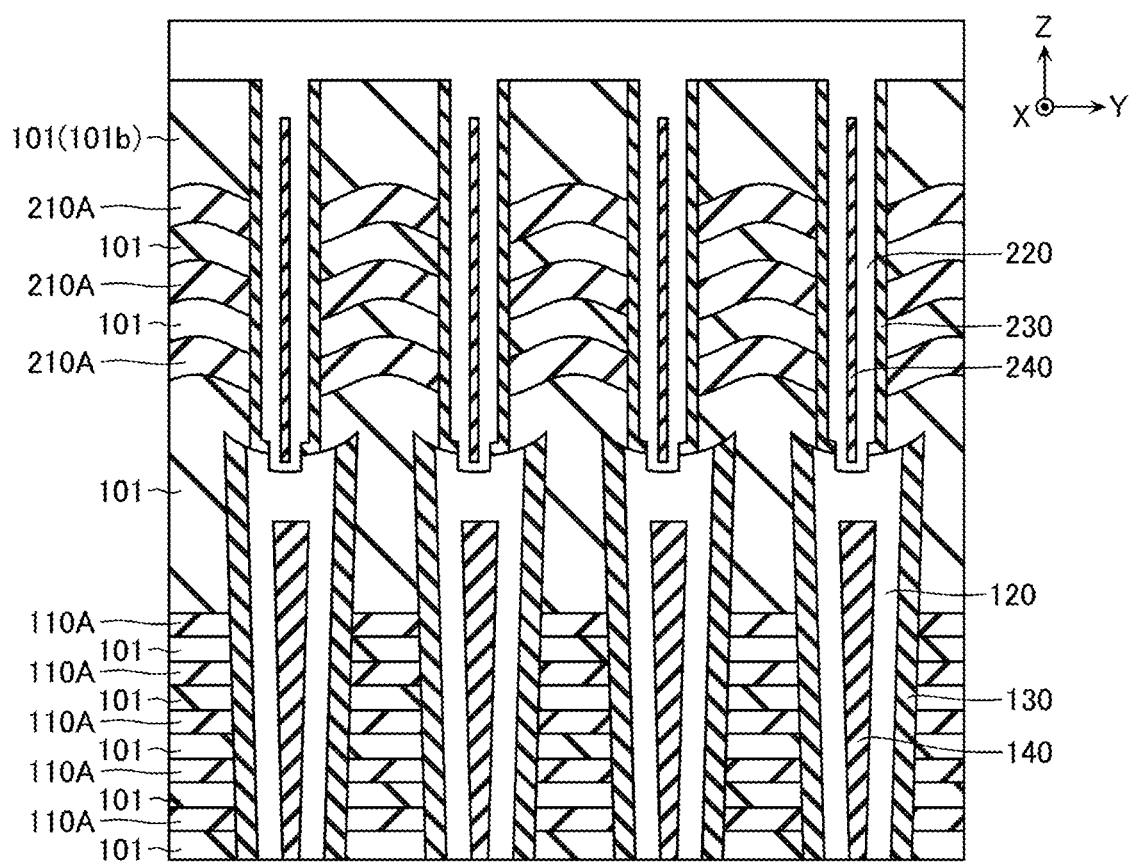
FIG. 18 is a schematic cross-sectional view illustrating the manufacturing method.

Next, as illustrated in FIG. 18, a portion of the semiconductor film 220 is formed on the upper surface of the interlayer insulating film 101b and the upper surface of the semiconductor film 220. This step is performed by, for example, a method such as the CVD.

Figure 19:
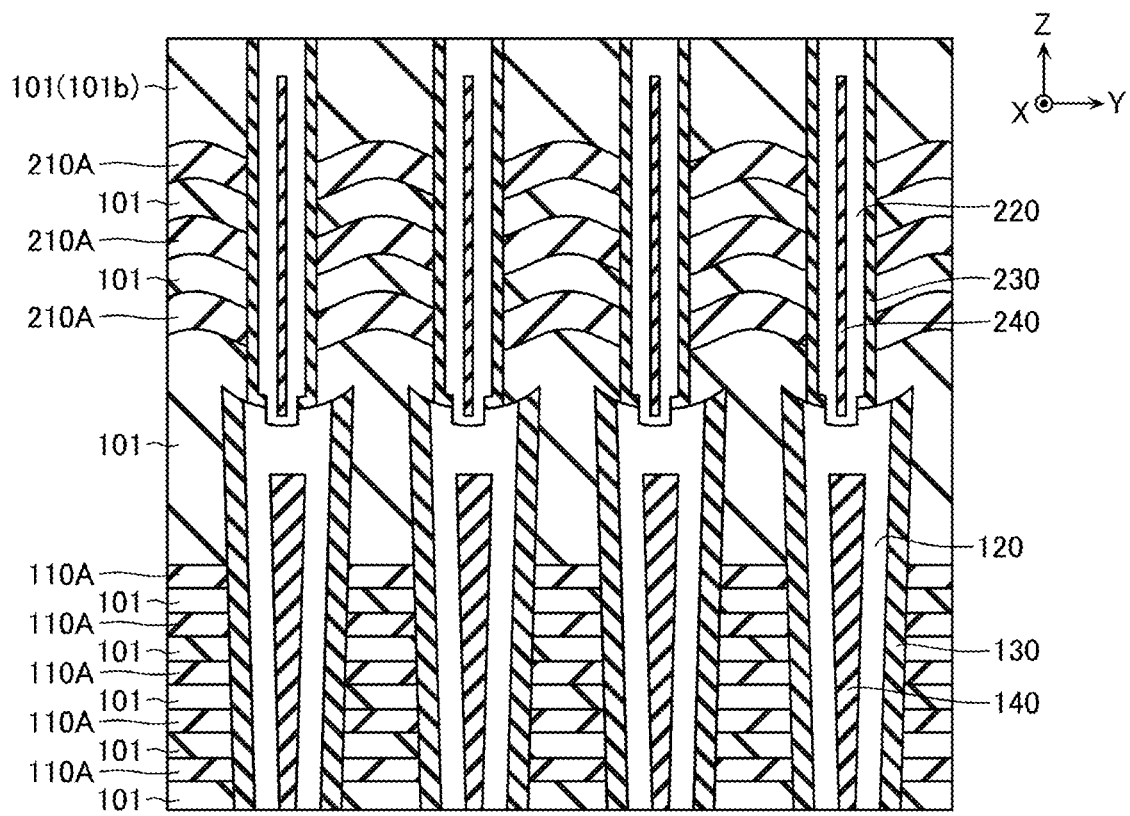
FIG. 19 is a schematic cross-sectional view illustrating the manufacturing method.

Next, as illustrated in FIG. 19, a portion of the semiconductor film 220 is removed. As a result, the upper surface of the interlayer insulating film 101b is exposed. This step is performed by, for example, a method such as the RIE.

Figure 20:
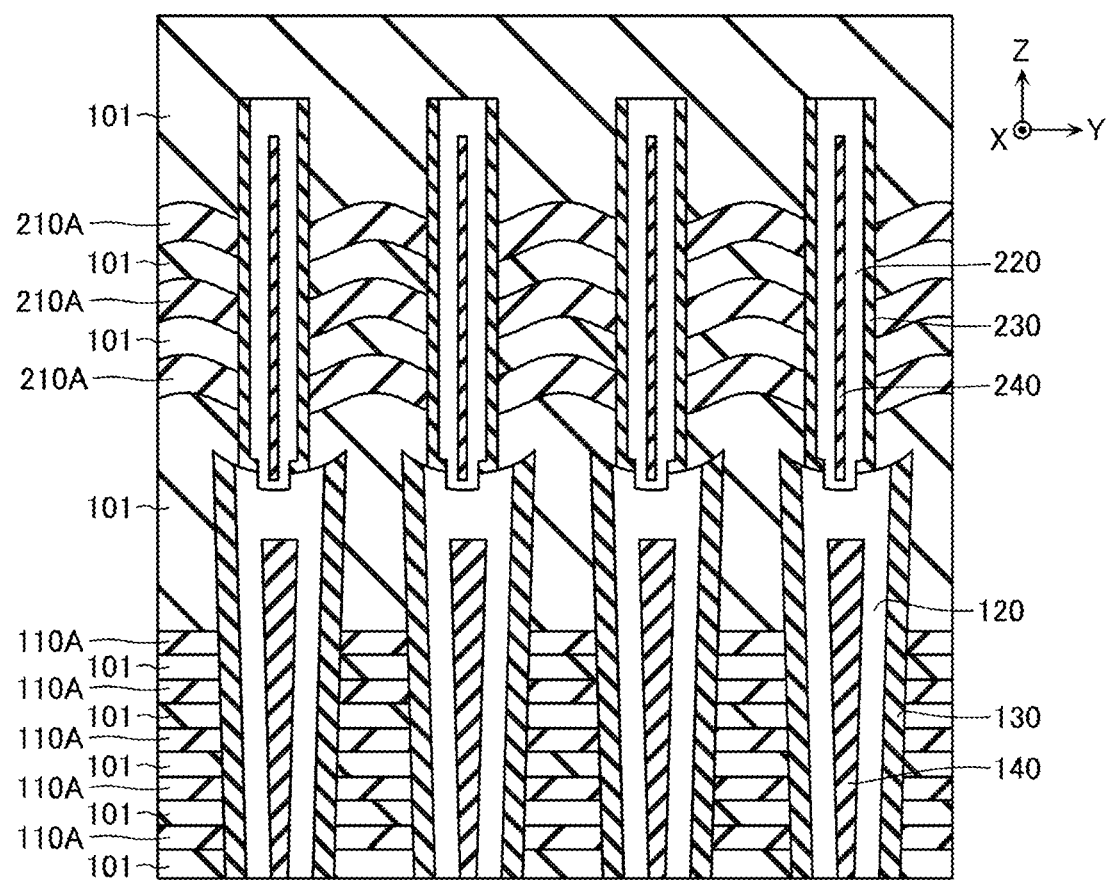
FIG. 20 is a schematic cross-sectional view illustrating the manufacturing method.

Next, as illustrated in FIG. 20, the interlayer insulating film 101 is formed on the upper surface of this structure. This step is performed by, for example, a method such as the CVD.

Figure 21:
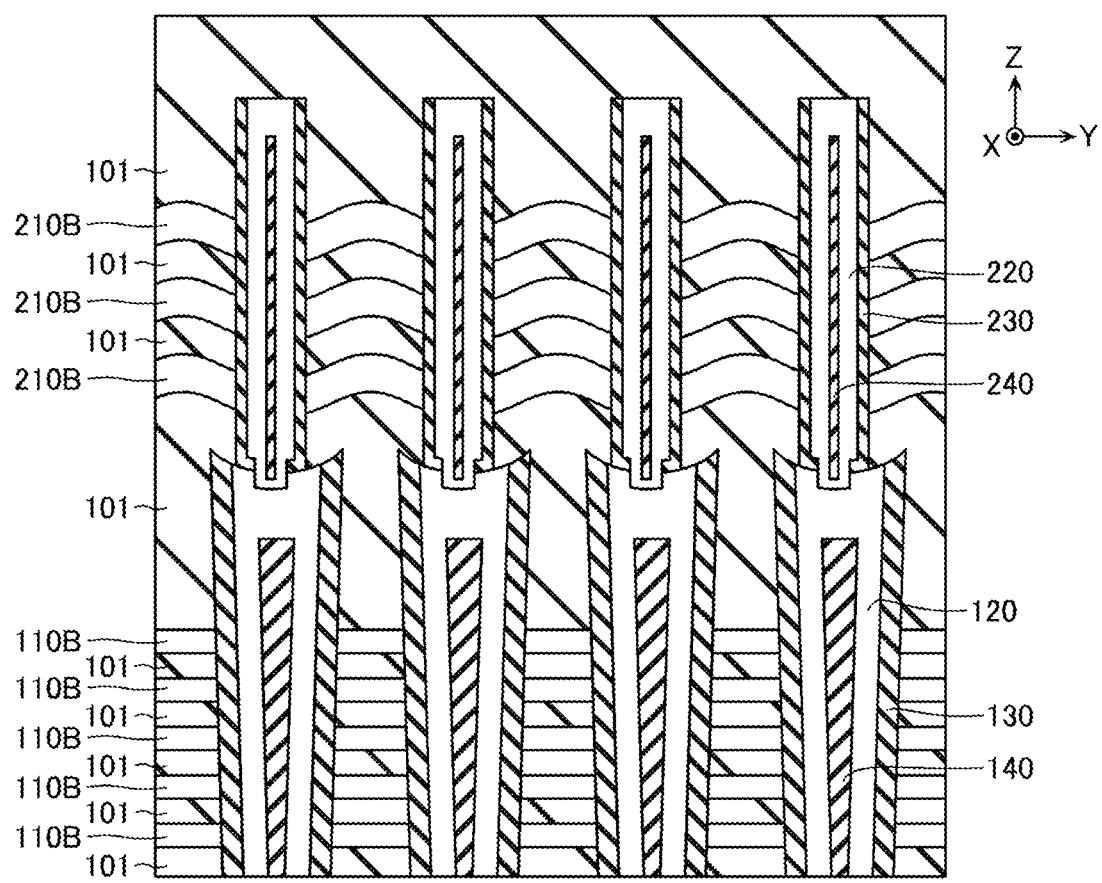
FIG. 21 is a schematic cross-sectional view illustrating the manufacturing method.

Next, as illustrated in FIG. 21, the sacrificial films 110A and 210A are removed through the opening which are not illustrated to form voids 110B and 210B. This step is performed by, for example, a method such as a wet etching.

Figure 22:
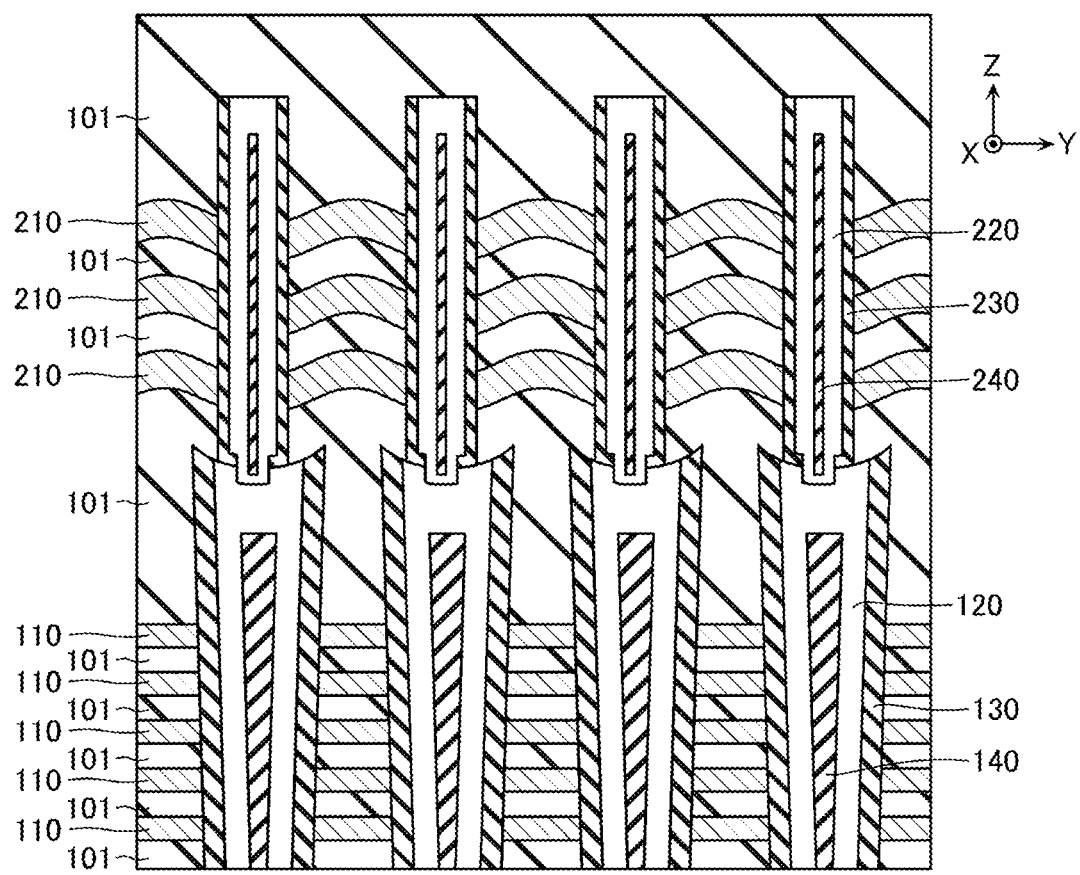
FIG. 22 is a schematic cross-sectional view illustrating the manufacturing method.

Next, as illustrated in FIG. 22, the conductive films 110 and 210 are formed in the voids 110B and 210B through the openings (not illustrated). This step is performed by, for example, a method such as the CVD. Further, the conductive film 102 described with reference to FIG. 4 is formed by a method such as the CVD. In addition, an insulating layer ST such as silicon oxide (FIG. 3) is formed in the opening (not illustrated) by, for example, a method such as the CVD.

Figure 23:
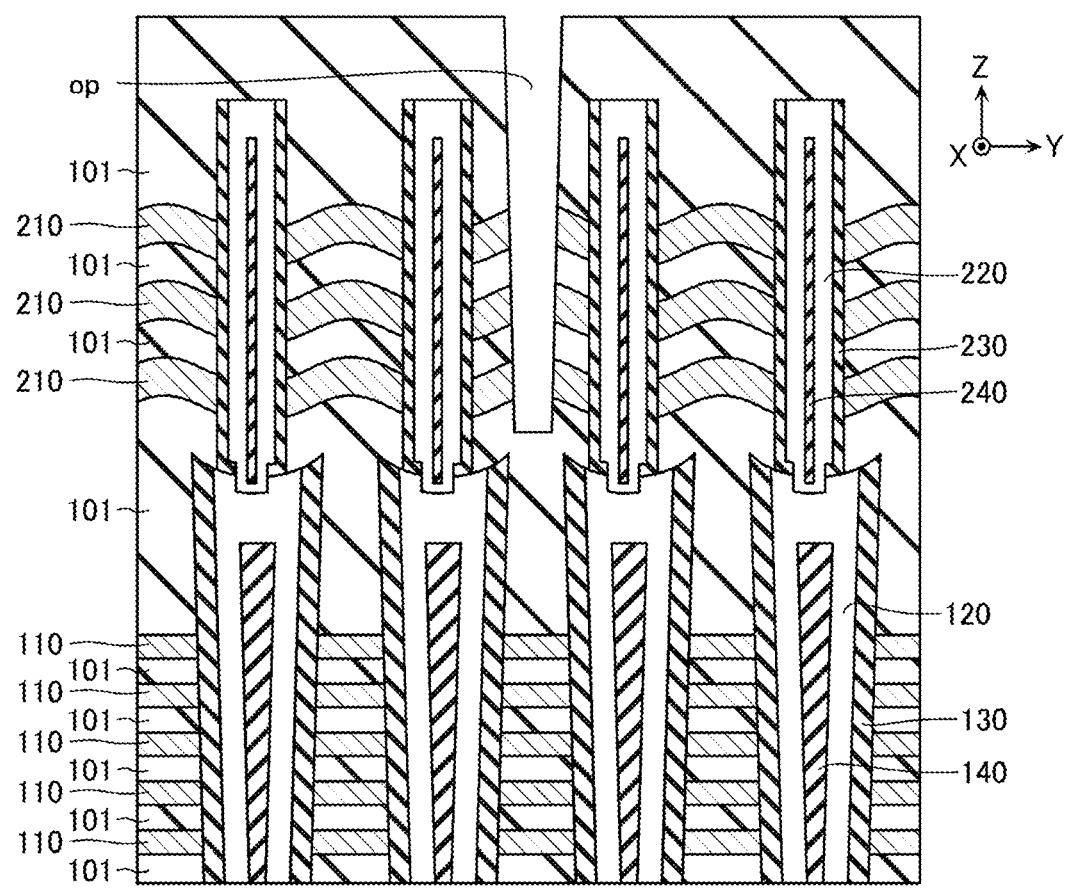
FIG. 23 is a schematic cross-sectional view illustrating the manufacturing method.

Next, as illustrated in FIG. 23, an opening op is formed. The opening op is a groove which extends in the Z direction and the X direction and divides the conductive film 210 and a portion of the interlayer insulating film 101 in the Y direction. This step is performed by, for example, a method such as the RIE.

Thereafter, the insulating portion SHE is formed in the opening op, and the contact 105 and the bit line BL are formed in the interlayer insulating film 101 located in the uppermost layer, thereby the structure described with reference to FIGS. 4 to 6 is formed.

[Effect]

Figure 24:
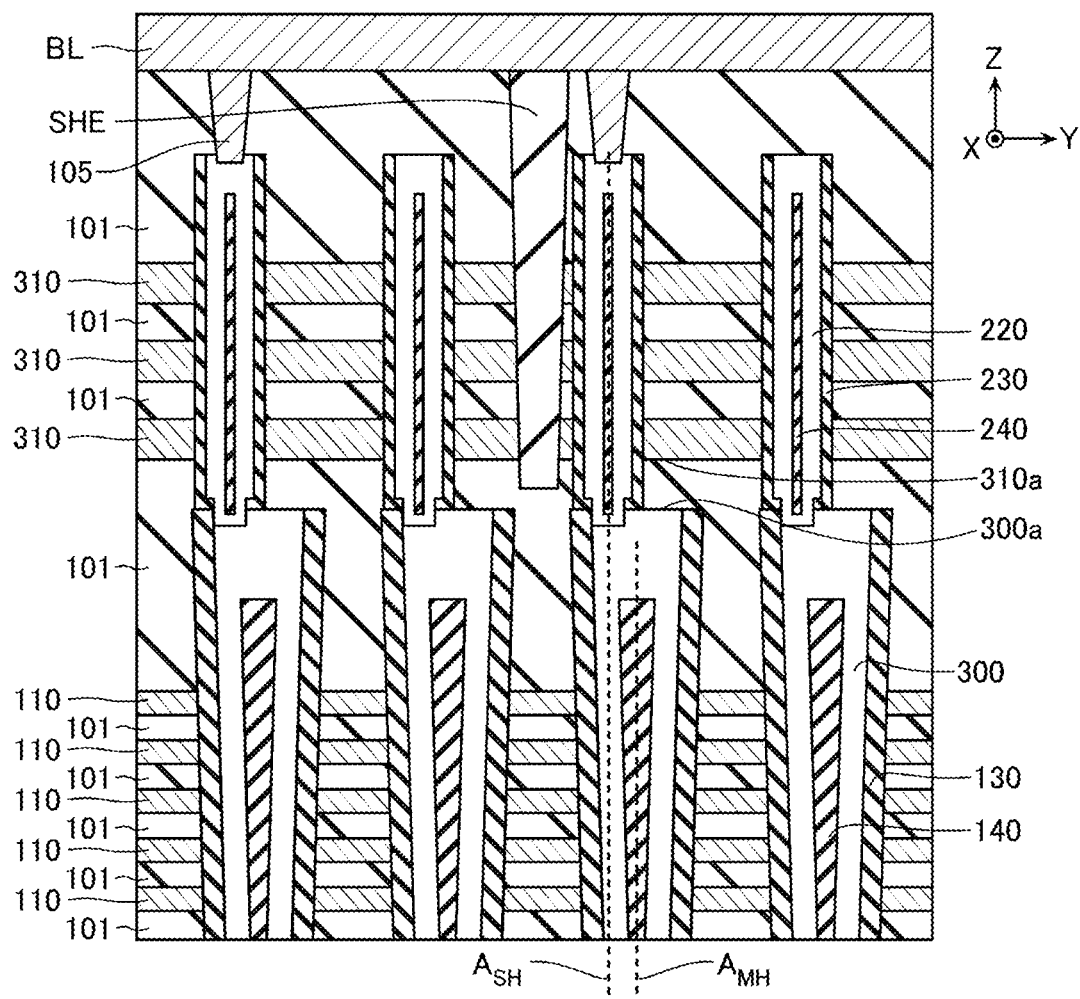
FIG. 24 is a schematic cross-sectional view illustrating a portion of the configuration of a semiconductor storage device according to a comparative example.

Next, the effects of the semiconductor storage device according to the first embodiment will be described with reference to FIGS. 24 and 25. FIG. 24 is a schematic diagram for illustrating a semiconductor storage device according to a comparative example. FIG. 25 is a schematic diagram for illustrating the semiconductor storage device according to the first embodiment. Meanwhile, FIGS. 24 and 25 illustrate the semiconductor storage device that is manufactured when a misalignment occurs when forming the through via hole SH (see FIG. 14), that is, when the central axis $A_{SH}$ of the through via hole SH deviates from the central axis $A_{MH}$ of the through via hole MH in the XY plane.

As illustrated in FIG. 24, the semiconductor storage device according to the comparative example is basically configured in the same manner as the semiconductor storage device according to the first embodiment. However, the semiconductor storage device according to the comparative example does not include the conductive film 210 and the semiconductor film 120. Further, the semiconductor storage device according to the comparative example includes a semiconductor film 300 which extends in the Z direction and faces a plurality of conductive films 110, and a plurality of conductive films 310 which are arranged in the Z direction and face the semiconductor film 220. The semiconductor film 300 is basically configured in the same manner as the conductive film 210, except that the upper surface thereof is formed to be substantially flat. The conductive film 310 is basically configured in the same manner as the conductive film 210, except that the upper and lower surfaces thereof have a substantially flat shape along the XY plane.

Here, in the read operation or the like, a gate voltage is applied to the plurality of conductive films 110 to form a channel of electrons (inversion layer) on the outer peripheral surface of the semiconductor film 300.

Further, in the read operation or the like, a gate voltage is applied to the plurality of conductive films 310 to form a channel of electrons (inversion layer) on the outer peripheral surface of the semiconductor film 220 and the upper surface of the semiconductor film 300. Thus, the channel formed on the outer peripheral surface of the semiconductor film 300 is electrically connected to the bit line BL.

In addition, in the read operation, it is determined whether a current flows to the bit line BL by applying a predetermined read voltage to a select word line WL (FIG. 1) and applying a predetermined voltage between the bit line BL and the source line SL.

Here, when the misalignment occurs in the comparative example, as illustrated in FIG. 24, the area of an upper surface 300a of the semiconductor film 300 becomes relatively larger than the area of a portion 310a which functions as the gate electrode on the lower surface of the conductive film 310. As a result, there is a possibility that a channel of electrons may not suitably formed on the upper surface 300a of the semiconductor film 300, and the channel formed on the outer peripheral surface of the semiconductor film 300 may not easily conduct to the bit line BL. Thus, the current flowing to the bit line BL (FIG. 1) is reduced, which may lower the reliability.

Here, as described above, when manufacturing the semiconductor storage device according to the first embodiment, the concave portion 120a is formed on the upper surface of the semiconductor film 120 as described with reference to FIG. 12. Next, as described with reference to FIG. 13, the interlayer insulating film 101, the sacrificial film 210A, and the like are formed along the upper surface of this structure. Thus, on the lower surface of the sacrificial film 210A, a substantially spherical convex portion 210Aa in which the height is shorter at portions closer to the central axis $A_{MH}$ of the through via hole MH is formed to correspond to the concave portion 120a on the upper surface of the semiconductor film 120. Next, as described with reference to FIG. 14, the through via holes SH are formed in this state.

In such an embodiment, for example, when the misalignment in the step described with reference to FIG. 14 is relatively small, the lowermost portion of a convex portion 210Aa on the lower surface of the sacrificial film 210A is removed in a certain range. Therefore, as illustrated in, for example, FIG. 6, a structure is manufactured in which the distance between the semiconductor film 120 and the conductive film 210 is relatively large.

Meanwhile, when the misalignment is relatively large, a portion located relatively below among the convex portions 210Aa on the lower surface of the sacrificial film 210A is not removed. Therefore, as illustrated in, for example, FIG. 25, a structure is manufactured in which the distance between the semiconductor film 120 and the conductive film 210 is relatively short.

Therefore, according to the present embodiment, it is possible to provide a semiconductor storage device which may be suitably controlled by preventing the reduction of the current of the bit line BL (FIG. 1) due to misalignment in a self-aligned manner.

Second Embodiment

Next, the semiconductor storage device according to the second embodiment will be described with reference to FIG. 26.

The semiconductor storage device according to the second embodiment is basically configured in the same manner as the semiconductor storage device according to the first embodiment. However, in the semiconductor storage device according to the second embodiment, a portion of the configuration of the conductive film 210 is different from that of the semiconductor storage device according to the first embodiment.

As described above, the upper and lower surfaces of the conductive film 210 are provided with unevenness in which the height changes substantially periodically corresponding to the arrangement period of the through via holes MH. Here, in the first embodiment (FIG. 6), the height difference due to the unevenness provided on the upper and lower surfaces of the conductive film 210 is substantially uniform among the plurality of conductive films 210 provided in the Z direction. Meanwhile, in the present embodiment, the conductive film 210 which is farther away from the substrate has a shorter height difference. Therefore, for example, focusing on a conductive film 210_1 provided at the lowermost position and a conductive film 210_2 provided above the conductive film 210_1 among the plurality of conductive films 210 provided in the Z direction, assuming that a distance from the upper end of the upper surface of a convex portion 210_1a of the conductive film 210_1 to the upper end of the lower surface of a convex portion 210_2a of the conductive film 210_2 is w1, and a distance from the lower end of the upper surface of a convex portion 210_1b of the conductive film 210_1 to the lower end of the lower surface of a convex portion 210_2b of the conductive film 210_2 is w2, the distance w1 is shorter than the distance w2.

Also, in such an embodiment, it is possible to provide a semiconductor storage device that may be suitably controlled by preventing the reduction in the current of the bit line BL (FIG. 1) due to misalignment in a self-aligned manner.

Figure 26:
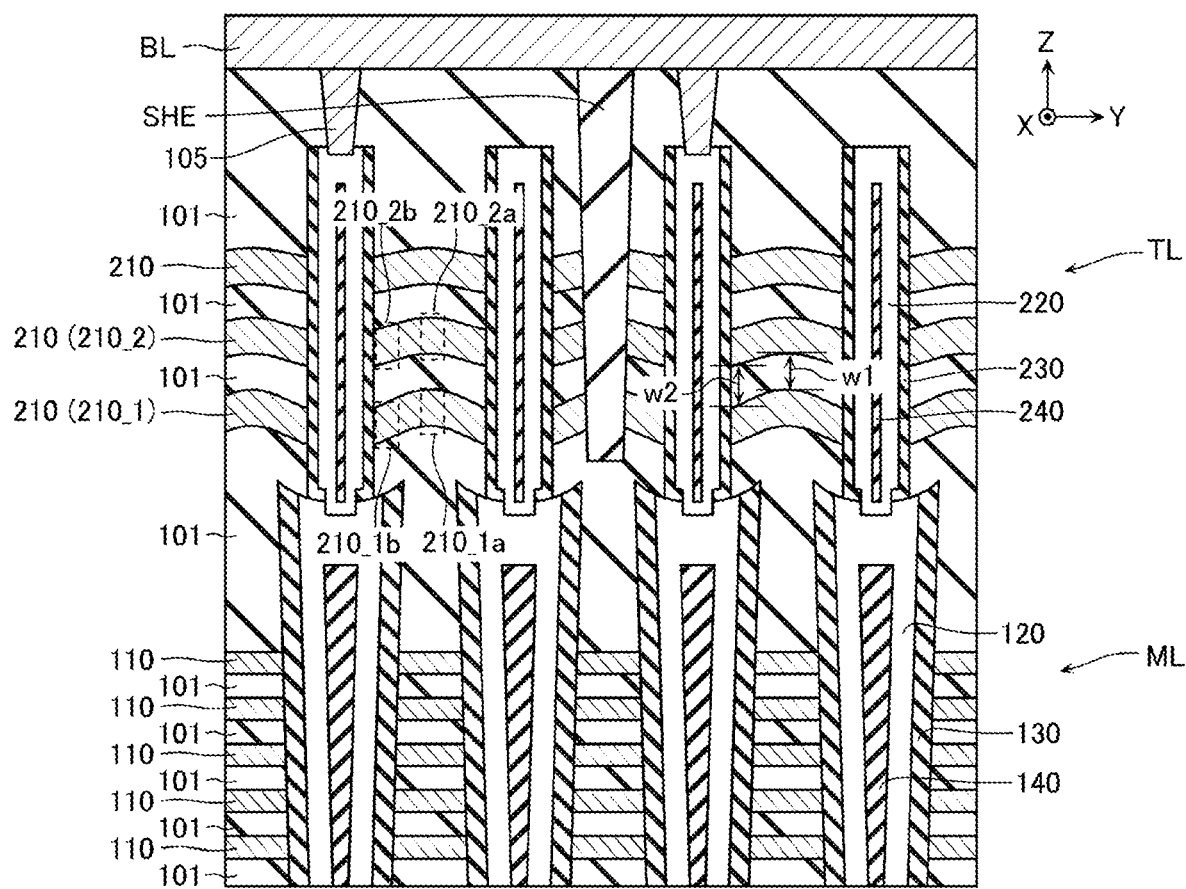
FIG. 26 is a schematic cross-sectional view illustrating a portion of the configuration of a semiconductor storage device according to a second embodiment.

Meanwhile, the example of FIG. 26 is merely an example, and the detailed structure at the time of design and manufacture, such as the degree of curvature of each conductive film 210, may be changed as appropriate.

Third Embodiment

Next, the semiconductor storage device according to the third embodiment will be described with reference to FIG. 27.

The semiconductor storage device according to the third embodiment is basically configured in the same manner as the semiconductor storage device according to the first embodiment. However, the semiconductor storage device according to the third embodiment includes only one conductive film 210. Further, the semiconductor storage device according to the third embodiment includes a plurality of conductive films 320 provided above the conductive film 210. The conductive film 320 is basically configured in the same manner as the conductive film 210, except that the upper and lower surfaces thereof have a substantially flat shape along the XY plane.

Also, in such an embodiment, it is possible to provide a semiconductor storage device that may be suitably controlled by preventing the reduction in the current of the bit line BL (FIG. 1) due to misalignment in a self-aligned manner.

Figure 27:
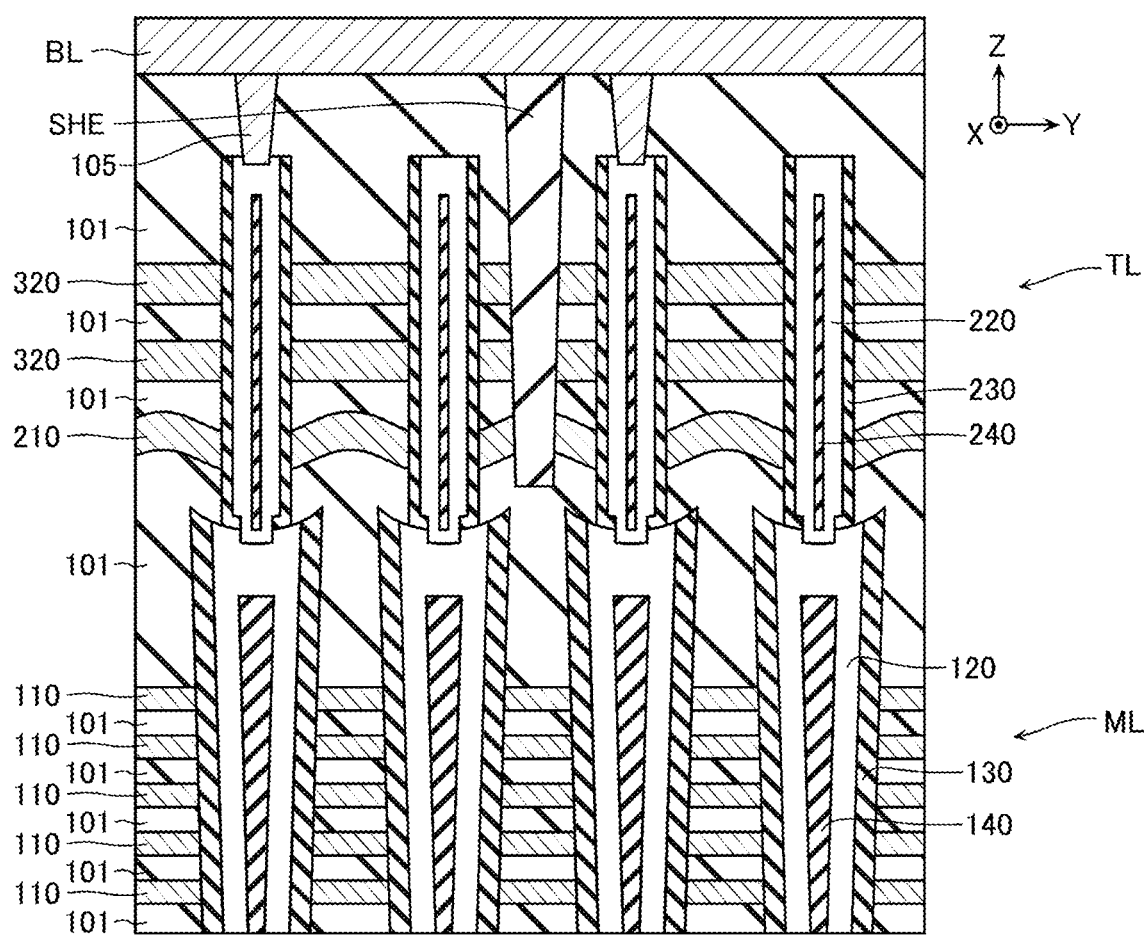
FIG. 27 is a schematic cross-sectional view illustrating a portion of the configuration of a semiconductor storage device according to a third embodiment.

Meanwhile, the example of FIG. 27 is merely an example, and a combination of the conductive film 210 having unevenness provided on the upper and lower surfaces with the conductive film 320 having the upper and lower surfaces formed substantially flat may be changed as appropriate. For example, two or more conductive films 210 may be provided, or only one conductive film 320 may be provided.

[Semiconductor Storage Device According to Other Embodiments]

The semiconductor storage devices according to the first to third embodiments have been described above. However, the above embodiments are merely examples, and specific configurations and the like may be changed as appropriate.

For example, the transistor layer TL (FIG. 6) according to the first embodiment includes the plurality of conductive films 210 which are arranged in the Z direction, as the drain select line SGD. However, for example, only one conductive film 210 may be provided in the transistor layer TL, and the conductive film 210 may be used as the drain select line SGD.

In addition, the upper and lower surfaces of the conductive film 210 according to the first to third embodiments are provided with unevenness in which the height changes substantially periodically corresponding to the arrangement period of the through via holes MH. However, for example, unevenness may be provided on only the lower surface, not on both the upper and lower surfaces.

Further, the conductive film 210 according to the first to third embodiments is a conductive film that contains a metal such as tungsten. However, the conductive film 210 may be a conductive film made of polycrystalline silicon or the like that contains an impurity such as phosphorus or boron, or may be a conductive film made of silicide or the like.

In addition, the semiconductor films 120 and the semiconductor films 220 according to the first to third embodiments have a substantially cylindrical shape. However, the shapes of the semiconductor film 120 and the semiconductor film 220 may be changed as appropriate. For example, the semiconductor film 120 and the semiconductor film 220 may have a cylindrical shape. In addition, the semiconductor film 120 and the semiconductor film 220 may have a quadrangular prism shape or another polygonal prism shape, or may have a quadrangular tubular shape or another polygonal tubular shape. Meanwhile, when at least one of the semiconductor film 120 and the semiconductor film 220 has a polygonal shape in the XY cross section, an axis passing through the center of the circumcircle of such a polygon may be set as the central axis.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a plurality of first gate electrodes spaced apart from one another in a first direction;
    a first semiconductor film extending through the plurality of first gate electrodes in the first direction;
    a second semiconductor film provided in a second direction of the first semiconductor film and extending through the plurality of first gate electrodes in the first direction, the second direction crossing the first direction;
    a first gate insulating film provided between the plurality of first gate electrodes and the first semiconductor film;
    a second gate insulating film provided between the plurality of first gate electrodes and the second semiconductor film;
    a second gate electrode disposed above an upmost one of the plurality of first gate electrodes;
    a third semiconductor film, extending through the second gate electrode in the first direction and includes one end in contact with an upper end of the first semiconductor film;
    a fourth semiconductor film, extending through the second gate electrode in the first direction and includes one end in contact with an upper end of the second semiconductor film;
    a third gate insulating film provided between the second gate electrode and the third semiconductor film; and
    a fourth gate insulating film provided between the second gate electrode and the fourth semiconductor film,
    wherein the second gate electrode includes:
        a first portion provided between the third semiconductor film and the fourth semiconductor film; and
        a second portion, provided between the first portion and the third semiconductor film, and
    wherein at least a portion of the second portion is provided closer to the upmost first gate electrode than the first portion along the first direction.

2. The semiconductor storage device according to claim 1, further comprising:
    a third gate electrode disposed farther away from the substrate than the second gate electrode along the first direction,
    wherein the third gate electrode includes:
        a third portion aligned with the first portion of the second gate electrode along the first direction; and
        a fourth portion aligned with the second portion of the second gate electrode along the first direction.

3. The semiconductor storage device according to claim 2, wherein, when a first distance, which is measured from the first portion of the second gate electrode to the third portion of the third gate electrode along the first direction, is shorter than a second distance, which is measured from the second portion of the second gate electrode to the fourth portion of the third gate electrode along the first direction.

4. The semiconductor storage device according to claim 2, wherein at least a portion of the fourth portion is provided closer to the substrate than the third portion along the first direction.

5. The semiconductor storage device according to claim 1, wherein the second gate electrode includes:
    a first facing portion facing a first side of the second semiconductor film along a second direction perpendicular to the first direction; and
    a second facing portion facing a second side of the second semiconductor film along the second direction,
    wherein a central axis of the second semiconductor film along the first direction is shifted from a central axis of the first semiconductor film toward the second side in the second direction, and
    wherein the first facing portion is closer to the first semiconductor film than the second facing portion along the second direction.

6. The semiconductor storage device according to claim 1, wherein
    the upper surface of the first semiconductor film has two or more different heights measured along the first direction relative to the surface of the substrate.

7. The semiconductor storage device according to claim 1, wherein
    the upper surface of the first semiconductor film includes a first height and a second height measured along the first direction relative to the surface of the substrate, and wherein
    the first height, which is closer to a central axis of the first semiconductor film along the first direction than the second height, is less than the second height.

* * * * *